(12) United States Patent
Matsuda et al.

(10) Patent No.: US 6,486,635 B1
(45) Date of Patent: Nov. 26, 2002

(54) MONITOR SIGNAL OUTPUT CIRCUIT, BATTERY PACK, BATTERY VOLTAGE MONITOR CIRCUIT, BATTERY SYSTEM, APPARATUS, BATTERY VOLTAGE MONITOR METHOD, AND BATTERY VOLTAGE MONITOR PROGRAM STORAGE MEDIUM

(75) Inventors: Kouichi Matsuda, Kawasaki (JP); Nakazawa Shigeaki, Kawasaki (JP); Mitsuo Saeki, Kawasaki (JP); Hidekiyo Ozawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/709,380

(22) Filed: Nov. 13, 2000

(30) Foreign Application Priority Data

Mar. 2, 2000 (JP) ........................ 2000-056724

(51) Int. Cl.⁷ ................................................ H02J 7/00
(52) U.S. Cl. ...................................... 320/134; 320/128
(58) Field of Search ........................ 320/134, 128, 320/162, 163, 164, 116, 118

(56) References Cited

U.S. PATENT DOCUMENTS

| 5,426,386 A | 6/1995 | Matthews et al. ............. 327/63 |
| 6,236,215 B1 * | 5/2001 | Kanehira .................... 320/118 |
| 6,262,494 B1 * | 7/2001 | Tsukuni et al. ............. 320/122 |

FOREIGN PATENT DOCUMENTS

| JP | 60-46467 | 3/1985 |
| JP | 06-260851 | 9/1994 |
| JP | 10-14122 | 1/1998 |
| JP | 10-233636 | 9/1998 |
| JP | 11-55865 | 2/1999 |

\* cited by examiner

*Primary Examiner*—Edward H. Tso
*Assistant Examiner*—Lawrence Luk
(74) *Attorney, Agent, or Firm*—Armstrong, Westerman & Hattori, LLP.

(57) ABSTRACT

Individual voltages of 1a plurality of batteries or voltage sources which are connected in series and voltages on both ends of the plurality of batteries or voltage sources are detected. An offset value of a differential amplifier is determined through an arithmetic operation for the detected voltages. The offset value thus determined is used to correct the measured values of the battery voltages.

22 Claims, 13 Drawing Sheets

MONITOR SIGNAL OUTPUT CIRCUIT, BATTERY PACK, BATTERY VOLTAGE MONITOR CIRCUIT, BATTERY SYSTEM, APPARATUS, BATTERY VOLTAGE MONITOR METHOD, AND BATTERY VOLTAGE MONITOR PROGRAM STORAGE MEDIUM

BACKGROUND OF THE INVENTION

1. Field of the Invention

The present invention relates to a monitor signal output circuit for outputting a monitor signal to monitor a voltage of a battery, a battery pack having a monitor signal output function, a battery voltage monitor circuit for monitoring a voltage of a battery in accordance with a monitor signal, a battery system and an apparatus each having a battery and a monitoring function for a voltage of the battery, a battery voltage monitor method for monitoring a voltage of a battery, and a battery voltage monitor program storage medium storing therein a program for a battery voltage monitor.

2. Description of the Related Art

Many of portable type of electronic apparatuses such as a note type of personal computer and the like are loaded with a battery for apparatuses.

In case of an apparatus which is operated on a desk, or in the event that a portable type of apparatus such as a note type of personal computer is operated on a desk, there is no need to consider such a matter that a supply of electric power for operating those types of apparatus operated by electric power from a commercial power supply through an AC adapter is interrupted. On the other hand, in case of an apparatus operative upon receipt of supply of electric power from a battery, there is a need for a user always to be aware of a residue of the battery. Particularly, in case of an information processing apparatus such as a notebook-sized personal computer and the like, there is a possibility that when the residue of the battery becomes zero (or the battery died), all of partially completed data will be erased. Accordingly, there is a need for a user to be aware of a state of consumption of the battery and to save the partially completed data onto a non-volatile storage medium such as a hard disk before the residue of the battery becomes zero.

For the purpose of preventing troubles involved in a situation that the residue of the battery becomes zero, the conventional notebook-sized personal computer and the like incorporates thereinto a system for monitoring the residue of the battery.

FIG. 11 shows a battery system having a battery residue monitor function.

A battery system 10 comprises a battery pack 20 and a battery voltage monitor section 30. The battery system 10 is incorporated into a notebook-sized personal computer 40. The battery pack 20 is connected with the battery voltage monitor section 30 in such a manner that a selection signal input terminal 20a of the battery pack 20, a battery voltage output terminal 20b of the battery pack 20, a power supply terminal 20c of the battery pack 20 and a ground terminal 20d of the battery pack 20 are connected with a selection signal output terminal 30a of the battery voltage monitor section 30, a battery voltage input terminal 30b of the battery voltage monitor section 30, a power supply terminal 30c of the battery voltage monitor section 30 and a ground terminal 30d of the battery voltage monitor section 30, respectively.

The battery voltage monitor section 30 shown in FIG. 11 comprises a DC-DC converter circuit 31 and a microcomputer 32 operative upon receipt of a supply of an electric power of 5.0 V from the DC-DC converter circuit 31.

The microcomputer 32 transmits a selection signal for optionally selecting any one; of three batteries $S_1$, $S_2$, and $S_3$, which are connected in series within the battery pack 20, via the selection signal output terminal 30a of the battery voltage monitor section 30 and the selection signal input terminal 20a of the battery pack 20 to a battery protection circuit 21 of the battery pack 20. The battery protection circuit 21 transmits in accordance with the selection signal a monitor signal representative of a voltage of the battery selected by the selection signal via the battery voltage output terminal 20b of the battery pack 20 and the battery voltage input terminal 30b of the battery voltage monitor section 30 to the microcomputer 32. The microcomputer 32 converts the transmitted battery voltage into a digital signal to recognize the battery voltage in form of a digital value, so that the residue of the battery is recognized from the battery voltage.

The battery pack 20 shown in FIG. 11 is provided with two FETs ($FET_1$ and $FET_2$). The batteries $S_1$, $S_2$, and $S_3$ are each a chargeable battery, for example, a lithium-ion battery. $FET_1$ of the two FETs turns off, when a voltage of the batteries $S_1$, $S_2$, and $S_3$ goes down to the lower limit, and thereby preventing an over discharge of the batteries $S_1$, $S_2$, and $S_3$. $FET_2$ turns off when the batteries $S_1$, $S_2$, and $S_3$ are completely charged and further charged, and thereby preventing an over-charge of the batteries $S_1$, $S_2$, and $S_3$.

FIG. 12 is a view showing an internal structure of the battery protection circuit of the battery pack 20 shown in FIG. 11. However, here, the prevention of the over discharge and the over charge of the batteries is not a main subject matter, and thus a circuit structure of the prevention of the over discharge and the over charge of the batteries and the associated description will be omitted.

The battery protection circuit 21 has: a selection signal input terminal 21a for inputting a selection signal; a monitor signal output terminal 21b for outputting a monitor signal representative of a voltage of a battery; a node connection terminal 21c connected to one end (a plus electrode of S1) of a plurality (three) of batteries S1, S2 and S3 connected in series; a node connection terminal 21d connected to a connecting point of two batteries S1 and S2; a node connection terminal 21e connected to a connecting point of two batteries S2 and S3; and a node connection terminal 21f connected to another, end (a minus electrode of S3) of the batteries S1, S2 and S3 connected in series. Both ends of the plurality (three) of batteries connected in series and the connecting points of the battery-to-battery are referred to as a 'node'.

The battery protection circuit 21 comprises three differential amplifiers $AMP_1$, $AMP_2$, and $AMP_3$, and a multiplexer MPX. The three differential amplifiers $AMP_1$, $AMP_2$, and $AMP_3$ are for inputting two nodes 21c and 21d, two nodes 21d and 21e, and two nodes 21e and 21f, respectively. Outputs of the three differential amplifiers $AMP_1$, $AMP_2$, and $AMP_3$ are fed to the multiplexer MPX. The multiplexer MPX selects one of the three inputs in accordance with the selection signal entered through the selection signal input terminal 21a and outputs the selected one through the monitor signal output terminal 21b.

The microcomputer 32 shown in FIG. 11 sequentially outputs the selection signal to optionally select the batteries S1, S2 and S3, and receives through an AD conversion the monitor signal representative of the associated voltages of the batteries S1, S2 and S3, and thus it is possible to know the voltages of the batteries S1, S2 and S3.

FIG. 13 is a graph showing a relation between a discharge time (a horizontal axis) and a battery voltage (a vertical axis) of a lithium-ion battery. FIG. 14 is a graph showing a relation between a battery voltage (a vertical axis) and a battery residue (a horizontal axis) of a lithium-ion battery.

As shown in FIG. 13, when a battery is used, a voltage of the battery is gradually lowered. When the voltage of the battery is monitored, as shown in FIG. 14, it is possible to know the residue of the battery from the voltage of the battery.

According to the microcomputer 32, it is possible to take measures to meet the situation that the battery is not usable, in such a manner that the microcomputer 32 detects the respective voltages of the batteries S1, S2 and S3 to know the residue of the batteries, so that the microcomputer 32 informs of the residue a user of the notebook-sized personal computer 40, and when the residue of the batteries draws to the limit in use, the microcomputer 32 alarms the user, and/or data are automatically saved.

Here, there will be explained an offset voltage of the differential amplifiers $AMP_1$, $AMP_2$, and $AMP_3$ shown in FIG. 12 and a measurement error caused by the offset voltage.

FIG. 15 is a circuit diagram showing one (here, the differential amplifier $AMP_1$) of the three differential amplifiers $AMP_1$, $AMP_2$ and $AMP_3$ shown in FIG. 12.

The differential amplifier $AMP_1$ comprises a differential amplifier $AMP_{11}$ and resistances connected around the differential amplifier. $AMP_{11}$. In FIG. 15, $R_1$ and $R_2$, which are applied to the resistances, imply resistance values as well as the resistances. $\alpha$ denotes an offset voltage of the differential amplifier $AMP_{11}$.

When a voltage to be applied to a noninverting input of the differential amplifier $AMP_1$ and a voltage to be applied to an inverting input of the differential amplifier $AMP_1$ are expressed by $V^+$ and $V^-$, respectively, an output voltage $V^0$ of the differential amplifier $AMP_1$ is given by equation (1) as set forth below.

$$V^0=(R_2/R_1)(V^+-V^-)+( (R_1+R_2)/R_1)\times\alpha \qquad (1)$$

FIG. 16 is a circuit diagram which is modified in the point that the inverting input of the differential amplifier shown in FIG. 15 is grounded. In this case, the an output voltage $V^0$ of the differential amplifier $AMP_1$ is given by equation (2) as set forth below.

$$V^0=(R_2/R_1)\times V^++((R_1+R_2)/R_1)\times\alpha \qquad (2)$$

FIG. 17 is a circuit diagram which is modified in the point that in the preceding stage of the differential amplifier shown in FIG. 15, there are provided differential amplifier $AMP_{12}$ and differential amplifier $AMP_{13}$ which serve as a buffer.

The differential amplifier $AMP_{12}$ and differential amplifier $AMP_{13}$ are buffer circuits for noninverting input and inverting input of the differential amplifier $AMP_{11}$ respectively. The differential amplifiers $AMP_{12}$ and $AMP_{13}$ serve to prevent a leakage of a current from the batteries $S_1$~$S_3$ by the resistances $R_1$ and $R_2$ for determining amplification factor of the differential amplifier $AMP_{11}$. The offset voltage $\alpha$ by the differential amplifiers $AMP_{12}$ and $AMP_{13}$ is a common mode input of the differential amplifier $AMP_{11}$ and is cancelled by the differential amplifier $AMP_{11}$. Therefore, it is sufficient to consider only the offset voltage of the differential amplifier $AMP_{11}$ also in the differential amplifier shown in FIG. 17. Thus, an output voltage $V^0$ of the differential amplifier $AMP_1$ is given, in a similar fashion to that of FIG. 15, by equation (1) as set forth below.

$$V^0=(R_2/R_1)(V^+-V^-)+((R_1+R_2)/R_1)\times\alpha \qquad (1)$$

As seen from equations (1) and (2), the amplification degree of the differential amplifier $AMP_1$ is determined by resistance values of the resistances $R_1$ and $R_2$, and accuracy of the amplification depends on the accuracy of the resistance values. As seen from equations (1) and (2), however, accuracy of the amplification is determined by ratio $R_2/R_1$ of the resistance values of the two resistances $R_1$ and $R_2$, but not the absolute value of the resistance values of the resistances $R_1$ and $R_2$. consequently, it is possible to implement a high accuracy of amplification degree by making inside an LSI the resistances $R_1$ and $R_2$ which determine the amplification degree. That is, in the event that the resistances are made in the LSI, the absolute value of the resistances is involved in the error of ±20–30% due to a diffusion dispersion of an impurity. To the contrary, the ratio of the resistance values of the two resistances can be controlled with great accuracy, and thus it is possible to prevent a dispersion of the ratio from rising more than 0.05%.

To the contrary, with respect to the offset voltage $\alpha$ of the differential amplifier, a dispersion in the manufacturing process of an LSI is directly reflected. Thus, when a plurality of differential amplifiers are made within the same LSI, the offset voltages $\alpha$ of the plurality of differential amplifiers, which are made within the same LSI, are almost the same as one another, but are large in difference among chips.

For example, it is necessary for a notebook-sized personal computer to detect the battery residue in accuracy of 1% or more. However, in this case, for the offset voltage $\alpha$ of the differential amplifier, it brings about a result of 2–3% or more in dispersion when the offset voltage $\alpha$ is converted into the battery residue.

In order to obtain a great accuracy of output of a differential amplifier, it may be considered that a fine control circuit is added to regulate the offset voltage $\alpha$ to be zero. However, this involves problems of a working amount required for the regulation of the offset voltage and rising of a cost for preparing a circuit for the regulation. Further, the offset voltage $\alpha$ is associated with a temperature change and a secular change, and thus even if the offset voltage $\alpha$ is regulated in the manner as mentioned above, it is difficult to cope with changes of the offset voltage $\alpha$ due to the temperature change and the secular change.

In order to cope with the problems as mentioned above, Japanese Patent Laid Open Gazette Hei. 6-260851 proposes a scheme that both the noninverting input and the inverting input of the differential amplifier are grounded at the time of the offset measurement, and then an output voltage of the differential amplifier is measured, so that the offset voltage is detected including temperature change and the secular change.

However, the offset voltage $\alpha$ is concerned with both the plus case and the minus case; nevertheless the above-mentioned proposed scheme is permitted to measure only the plus case of the offset voltage $\alpha$. For this reason, according to Japanese Patent Laid Open Gazette Hei. 6-260851, there is proposed a scheme that the offset voltage is regulated beforehand so that the offset voltage always offers the plus even if the temperature change and the secular change are concerned.

However, also in case of the proposed scheme, there is a need to prepare a circuit for regulation of the offset voltage and to perform a working of regulation of the offset voltage. Thus, it is unavoidable that the cost rises.

SUMMARY OF THE INVENTION

In view of the foregoing, it is an object of the present invention to provide a monitor signal output circuit, a battery pack, a battery voltage monitor circuit, a battery system, an apparatus, a battery voltage monitor method, and a battery voltage monitor program storage medium, which need no pre-regulation, and are capable of measuring a battery voltage with great accuracy.

The present invention can be classified to two groups of a first group in which battery voltages are measured with great accuracy, and a second group in which battery voltages are measured with great accuracy, and in addition such a great accuracy of measurement is implemented by a circuit operative on a low voltage of the power source.

To achieve the above-mentioned objects, the present invention provides a first monitor signal output circuit, which belongs to the first group, comprising:

a differential amplifier for monitor signal output; and a change-over circuit for changing over a connection between a plurality of batteries connected in series and an input of said differential amplifier in accordance with a selection signal so that said differential amplifier outputs a signal according to the selection signal of a plurality of signals including signals representative of voltages of the plurality of batteries and a voltage involved in a combination of predetermined two or more batteries.

To achieve the above-mentioned objects, the present invention provides a first battery pack, which belongs to the first group, incorporating a plurality of batteries connected in series, and a monitor signal output circuit having a differential amplifier which outputs a signal selected in accordance with a selection signal of a plurality of signals including signals representative of voltages of the plurality of batteries and a voltage involved in a combination of predetermined two or more batteries.

In the battery pack according to the present invention as mentioned above, it is preferable that said battery pack further incorporates a battery voltage monitor circuit having:

an offset computing section for computing an offset voltage of said differential amplifier in accordance with a plurality of signals derived from said monitor signal output circuit; and an offset correction section for correcting measurement errors of voltages of the plurality of batteries using the offset voltage computed in said offset computing section.

In this case, it is acceptable that said offset computing section computes the offset voltage of said differential amplifier in accordance with three signals representative of a first voltage involved in at least one part of battery of the plurality of batteries, a second voltage involved in at least one another part of battery of the plurality of batteries, and a third voltage involved in two or more batteries in combination of said part of battery and said another part of battery.

To achieve the above-mentioned objects, the present invention provides a first battery voltage monitor circuit comprising:

an offset computing section for computing an offset voltage of a differential amplifier, which outputs a signal selected in accordance with a selection signal of a plurality of signals including signals representative of voltages of a plurality of batteries connected in series and a voltage involved in a combination of predetermined two or more batteries, in accordance with a plurality of signals derived from a monitor signal output circuit having said differential amplifier; and an offset correction section for correcting measurement errors of voltages of the plurality of batteries using the offset voltage computed in said offset computing section.

In the battery voltage monitor circuit according to the present invention as mentioned above, it is acceptable that said offset computing section computes the offset voltage of said differential amplifier in accordance with three signals representative of a first voltage involved in at least one part of battery of the plurality of batteries, a second voltage involved in at least one another part of battery of the plurality of batteries, and a third voltage involved in two or more batteries in combination of said part of battery and said another part of battery.

To achieve the above-mentioned objects, the present invention provides a first battery system comprising:

a plurality of batteries connected in series;

a monitor signal output circuit having a differential amplifier which outputs a signal selected in accordance with a selection signal of a plurality of signals including signals representative of voltages of the plurality of batteries and a voltage involved in a combination of predetermined two nor more batteries; and a battery voltage monitor circuit having an offset computing section for computing an offset voltage of said differential amplifier in accordance with a plurality of signals derived from said monitor signal output circuit, and an offset correction section for correcting measurement errors of voltages of the plurality of batteries using the offset voltage computed in said offset computing section.

To achieve the above-mentioned objects, the present invention provides a first apparatus operative upon receipt of supply of an electric power, said apparatus comprising:

a plurality of batteries connected in series;

a monitor signal output circuit having a differential amplifier which outputs a signal selected in accordance with a selection signal of a plurality of signals including signals representative of voltages of the plurality of batteries and a voltage involved in a combination of predetermined two or more batteries; and a battery voltage monitor circuit having an offset computing section for computing an offset voltage of said differential amplifier in accordance with a plurality of signals derived from said monitor signal output circuit, and an offset correction section for correcting measurement errors of voltages of the plurality of batteries using the offset voltage computed in said offset computing section.

To achieve the above-mentioned objects, the present invention provides a first battery voltage monitor method comprising steps of:

computing an offset voltage of a differential amplifier, which outputs a signal selected in accordance with a selection signal of a plurality of signals including signals representative of voltages, of a plurality of batteries connected in series and a voltage involved in a combination of predetermined two or more batteries, in accordance with a plurality of signals derived from a monitor signal output circuit having said differential amplifier; and correcting measurement errors of voltages of the plurality of batteries using the offset voltage computed in said offset computing section.

To achieve the above-mentioned objects, the present invention provides a first battery voltage monitor program storage medium storing a battery voltage monitor program which causes a computer to operate as an apparatus for monitoring a voltage of a battery when the battery voltage monitor program is executed in said computer, wherein said battery voltage monitor program storage medium stores the battery voltage monitor program having an offset computing section for computing an offset voltage of a differential amplifier, which outputs a signal selected in accordance with a selection signal of a plurality of signals including signals representative of voltages of a plurality of batteries connected in series and a voltage involved in a combination of predetermined two or more batteries, in accordance with a plurality of signals derived from a monitor signal output circuit having said differential amplifier; and an offset correction section for correcting measurement errors of voltages of the plurality of batteries using the offset voltage computed in said offset computing section.

According to the above-mentioned invention belonging to the first group, an offset voltage of the differential amplifier is measured utilizing such a feature that the offset voltage is constant in both cases that a voltage of any one of a plurality of batteries connected in series is measured, or that voltages of two or more batteries connected in series is measured, and a measurement error is corrected from the measured battery voltage. Thus, it is possible to measure and correct the offset voltage at the time of measurement, including changes of temperature and secular change, without provision of an adjustment in advance, and thereby measuring the battery voltage with great accuracy.

To achieve the above-mentioned objects, the present invention provides a second monitor signal output circuit, which belongs to the second group, comprising:

a differential amplifier for monitor signal output; and a change-over circuit for selecting in accordance with a selection signal any one of a plurality of signal pairs consisting of a signal pair representative of voltages on two nodes, which are selected in accordance with the selection signal, of a plurality of nodes consisting of both ends of a plurality of voltage sources connected in series and connecting points of the voltage sources, and a signal pair representative of a voltage of one battery, which is selected in accordance with the selection signal, of a plurality of batteries connected in series and slice voltages on said plurality of voltage sources, said change-over circuit feeding a selected signal pair to said differential amplifier.

To achieve the above-mentioned objects, the present invention provides a second battery pack, which belongs to the second group, incorporating a plurality of batteries connected in series, and a monitor signal output circuit having a differential amplifier which outputs a signal selected in accordance with a selection signal of a plurality of signals consisting of a signal representative of a voltage between two nodes, which are selected in accordance with the selection signal, of a plurality of nodes consisting of both ends of a plurality of voltage sources connected in series and connecting points of the voltage sources, and a signal representative of a difference voltage between a voltage of one battery, which is selected from among the plurality of batteries in accordance with the selection signal and slice voltages on said plurality of voltage sources.

In the battery pack according to the present invention as mentioned above, it is acceptable that said battery pack further incorporates said plurality of voltage sources.

Alternatively, it is acceptable that said plurality of voltage sources are adapted for an external connection, and said battery pack has terminals to which nodes of said plurality of voltage sources are connected.

Further, it is also acceptable that said battery pack further incorporates a battery voltage monitor circuit having:

an offset computing section for computing an offset voltage of said differential amplifier in accordance with a plurality of signals derived from said monitor signal output circuit, each of said plurality of signals being representative of a voltage between nodes in which at least one node is different from another node; and an offset correction section for correcting measurement errors of voltages of the plurality of batteries in accordance with the signals representative of difference voltages associated with the plurality of batteries, derived from said monitor signal output circuit, and the offset voltage computed in said offset computing section. In this case, it is acceptable that said offset computing section computes the offset voltage of said differential amplifier in accordance with three signals representative of a first voltage involved in a first voltage source of the plurality of voltage sources, a second voltage involved in a second voltage source of the plurality of voltage sources, and a third voltage involved in a voltage source in combination of said first voltage source and said second voltage source.

To achieve the above-mentioned objects, the present invention provides a second battery voltage monitor circuit, which belongs to the second group, comprising:

an offset computing section for computing an offset voltage of a differential amplifier, which outputs a signal selected in accordance with a selection signal of a plurality of signals consisting of a signal representative of a voltage between two nodes, which are selected in accordance with the selection signal, of a plurality of nodes consisting of both ends of a plurality of voltage sources connected in series and connecting points of the voltage sources, and a signal representative of a difference voltage between a voltage of one battery, which is selected from among the plurality of batteries in accordance with the selection signal and slice voltages on said plurality of voltage sources, in accordance with a plurality of signals derived from a monitor signal output circuit having said differential amplifier, each of said plurality of signals being representative of a voltage between nodes in which at least one node is different from another node; and an offset correction section for correcting measurement errors of voltages of the plurality of batteries in accordance with the signals representative of difference voltages associated with the plurality of batteries, derived from said monitor signal output circuit, and the offset voltage computed in said offset computing section.

In the second battery voltage monitor circuit according to the present invention as mentioned above, it is acceptable that said offset computing section computes the offset voltage of said differential amplifier in accordance with three signals representative of a first voltage involved in a first voltage source of the plurality of voltage sources, a second voltage involved in a second voltage source of the plurality of voltage sources, and a third voltage involved in a voltage source in combination of said first voltage source and said second voltage source.

To achieve the above-mentioned objects, the present invention provides a second battery system, which belongs to the second group, comprising:

a plurality of batteries connected in series;

a plurality of voltage sources connected in series;

a monitor signal output circuit having a differential amplifier which outputs a signal selected in accordance with a selection signal of a plurality of signals consisting of a signal representative of a voltage between two nodes, which are selected in accordance with the selection signal, of a plurality of nodes consisting of both ends of said plurality of voltage sources connected in series and connecting points of the voltage sources, and a signal representative of a difference voltage between a voltage of one battery, which is selected from among the plurality of batteries in accordance with the selection signal and slice voltages on said plurality of voltage sources; and a battery voltage monitor circuit having an offset computing section for computing an offset voltage of said differential amplifier in accordance with a plurality of signals derived from said monitor signal output circuit, each of said plurality of signals being representative of a voltage between nodes in which at least one node is different from another node, and an offset correction section for correcting measurement errors of voltages of the plurality of batteries in accordance with the signals representative of difference voltages associated with the plurality of batteries, derived from said monitor signal output circuit, and the offset voltage computed in said offset computing section.

To achieve the above-mentioned objects, the present invention provides a second apparatus operative upon receipt of supply of an electric power, which belongs to the second group, said apparatus comprising:

a plurality of batteries connected in series;

a plurality of voltage sources connected in series;

a monitor signal output circuit having a differential amplifier which outputs a signal selected in accordance with a selection signal of a plurality of signals consisting of a signal representative of a voltage between two nodes, which are selected in accordance with the selection signal, of a plurality of nodes consisting of both ends of said plurality of voltage sources connected in series and connecting points of the voltage sources, and a signal representative of a difference voltage between a voltage of one battery, which is selected from among the plurality of batteries in accordance with the selection signal and slice voltages on said plurality of voltage sources; and a battery voltage monitor circuit having an offset computing section for computing an offset voltage of said differential amplifier in accordance with a plurality of signals derived from said monitor signal output circuit, each of said plurality of signals being representative of a voltage between nodes in which at least one node is different from another node, and an offset correction section for correcting measurement errors of voltages of the plurality of batteries in accordance with the signals representative of difference voltages associated with the plurality of batteries, derived from said monitor signal output circuit, and the offset voltage computed in said offset computing section.

To achieve the above-mentioned objects, the present invention provides a second battery voltage monitor method, which belongs to the second group, comprising steps of:

computing an offset voltage of a differential amplifier, which outputs a signal selected in accordance with a selection signal of a plurality of signals consisting of a signal representative of a voltage between two nodes, which are selected in accordance with the selection signal, of a plurality of nodes consisting of both ends of a plurality of voltage sources connected in series and connecting points of the voltage sources, and a signal representative of a difference voltage between a voltage of one battery, which is selected from among the plurality of batteries in accordance with the selection signal and slice voltages on said plurality of voltage sources, in accordance with a plurality of signals derived from a monitor signal output circuit having said differential amplifier, each of said plurality of signals being representative of a voltage between nodes in which at least one node is different from another node; and correcting measurement errors of voltages of the plurality of batteries in accordance with the signals representative of difference voltages associated with the plurality of batteries, derived from said monitor signal output circuit, and the offset voltage computed in said offset computing section.

To achieve the above-mentioned objects, the present invention provides a second battery voltage monitor program storage medium storing a battery voltage monitor program which causes a computer to operate as an apparatus for monitoring a voltage of a battery when the battery voltage monitor program is executed in said computer, wherein said battery voltage monitor program storage medium stores the battery voltage monitor program having an offset computing section for computing an offset voltage of a differential amplifier, which outputs a signal selected in accordance with a selection signal of a plurality of signals consisting of a signal representative of a voltage between two nodes, which are selected in accordance with the selection signal, of a plurality of nodes consisting of both ends of a plurality of voltage sources connected in series and connecting points of the voltage sources, and a signal representative of a difference voltage between a voltage of one battery, which is selected from among the plurality of batteries in accordance with the selection signal and slice voltages on said plurality of voltage sources, in accordance with a plurality of signals derived from a monitor signal output circuit having said differential amplifier, each of said plurality of signals being representative of a voltage between nodes in which at least one node is different from another node; and an offset correction section for correcting measurement errors of voltages of the plurality of batteries in accordance with the signals representative of difference voltages associated with the plurality of batteries, derived from said monitor signal output circuit, and the offset voltage computed in said offset computing section.

According to the above-mentioned invention, which belongs to the second group, an offset voltage of the differential amplifier is determined through a measurement of voltages of a plurality of voltage sources connected in series, and slice voltages on the plurality of voltage sources are determined from the differential amplifier, so that the battery voltage subtracting the slice voltage is outputted to monitor the battery voltage. This feature makes it possible to monitor the battery voltage with greater accuracy by a circuit of a low voltage.

Particularly, in case of the lithium-ion battery having characteristics shown in FIGS. 13 and 14, the voltage on a state that it is completely charged is about 4V, and the voltage on a state that it is discharged up to the degree unavailable is 3V. Thus, the difference is 1V or so. Therefore, determination of a suitable slice voltage makes it possible to sufficiently monitor the battery voltage with a circuit operative on the battery voltage of, for example, 3V or so.

DETAILED DESCRIPTION OF PREFERRED EMBODIMENTS

Embodiments of the present invention will be described with reference to the accompanying drawings.

Figure 1:
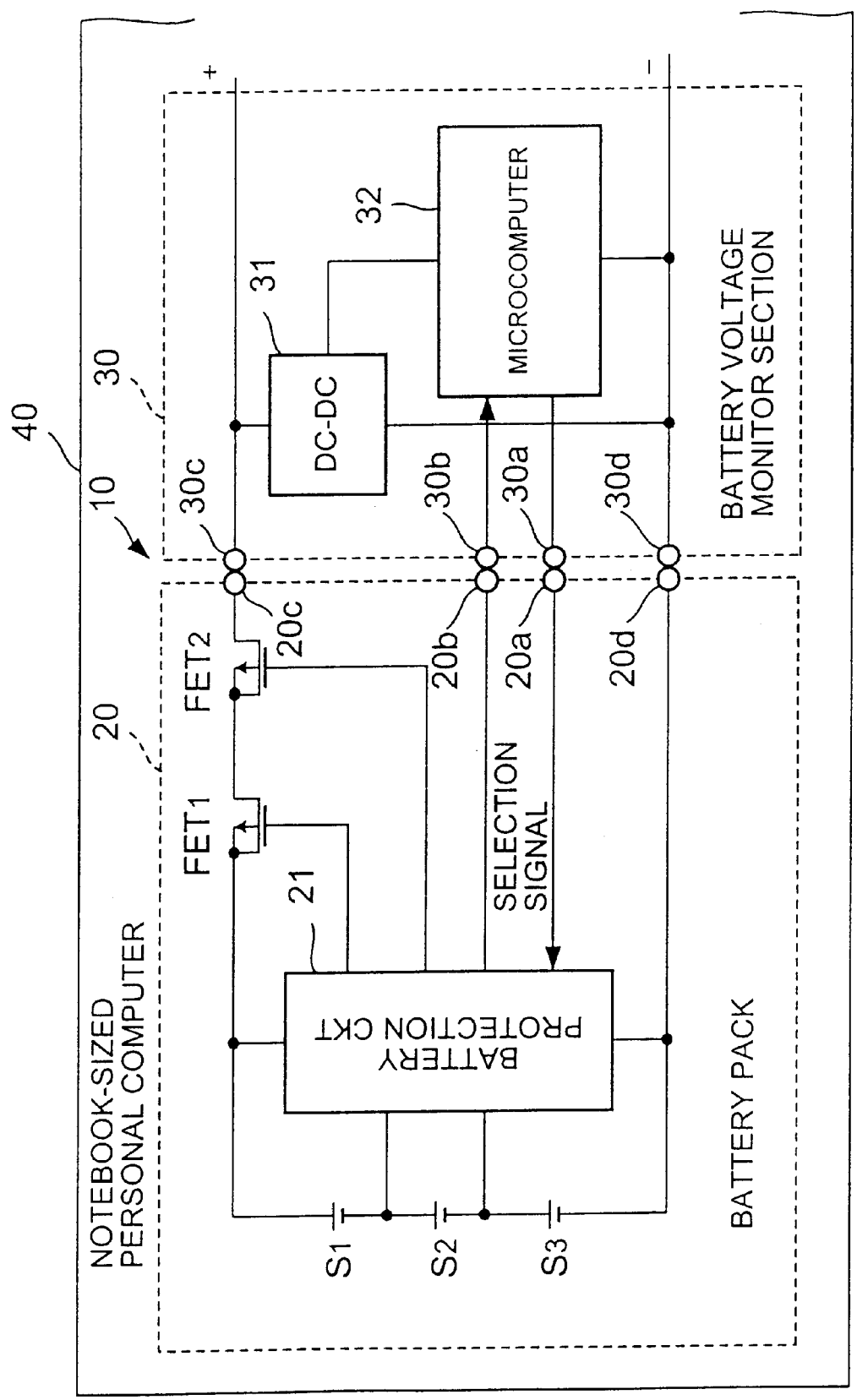
FIG. 1 is a schematic diagram of a first embodiment of the present invention.

FIG. 1 is a schematic diagram of a first embodiment of the present invention.

In FIG. 1, a battery pack 20 corresponds to an example of a battery pack of the present invention, a battery protection circuit 21, which is incorporated in the battery pack 20, corresponds to an example of a monitor signal output circuit of the present invention, a combination of the battery pack 20 and a battery voltage monitor section 30 corresponds to an example of a battery system referred to in the present invention, the battery voltage monitor section 30 corresponds to an example of a battery voltage monitor circuit of the present invention, a notebook-sized personal computer 40 corresponds to an example of an apparatus of the present invention, one, in which a battery voltage monitor program to be executed in a microcomputer 32 of the battery voltage monitor section 30 is grasped as a method, corresponds to an example of a battery voltage monitor method, and a program ROM (cf. FIG. 4) incorporated in the microcomputer 32 corresponds to an example of a battery voltage monitor program storage medium of the present invention.

Figure 11:
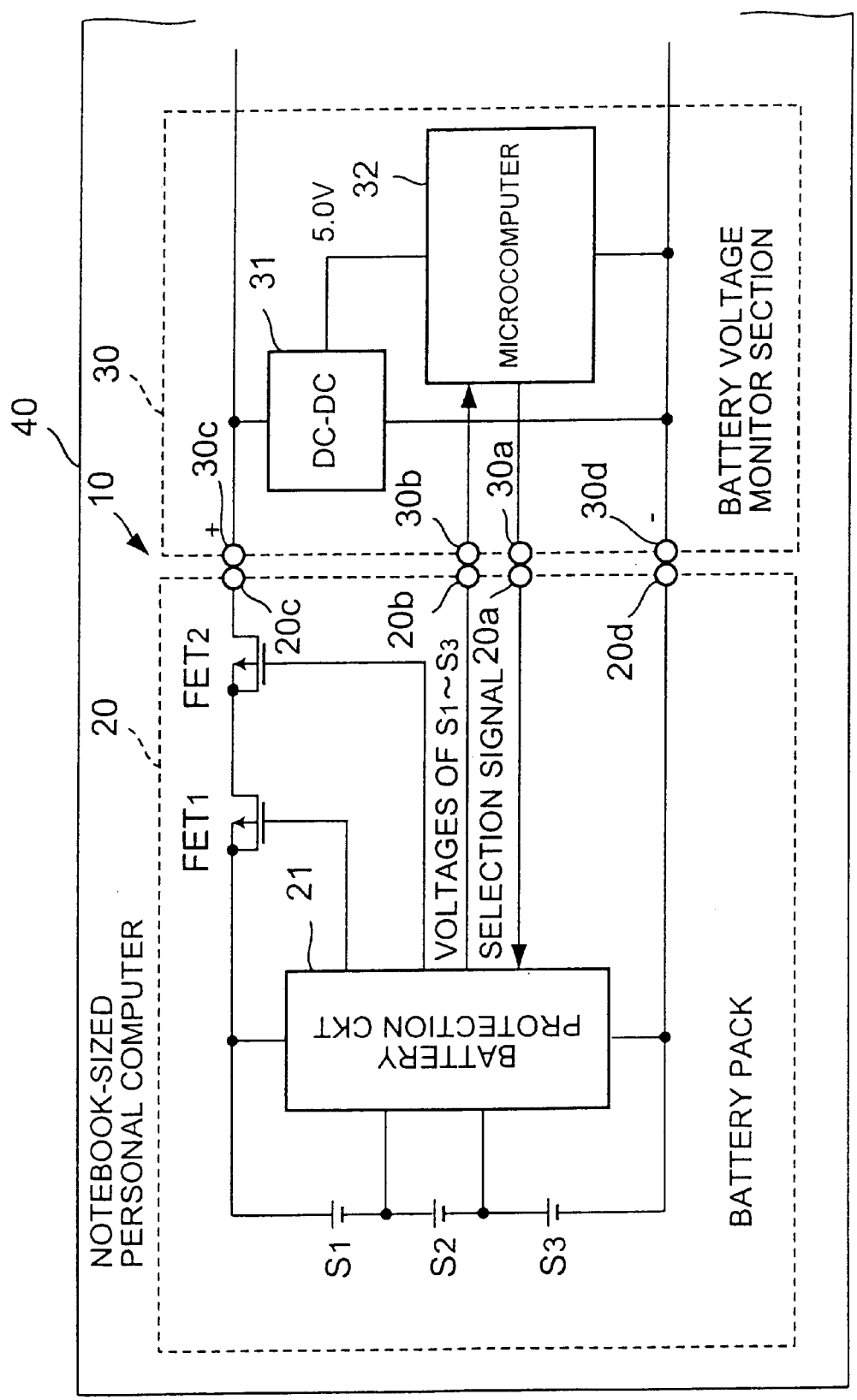
FIG. 11 shows a battery system having a battery residue monitor function.

FIG. 1 is similar to FIG. 11 as mentioned above, and in FIG. 1, the same parts are denoted by the same reference numbers as those of FIG. 11, and the redundant description will be omitted. Important features of the present embodiment reside in the structure of the battery protection circuit 21 and a battery voltage monitor program to be executed in the microcomputer 32. Hereinafter there will be explained details of the present embodiment.

Figure 2:
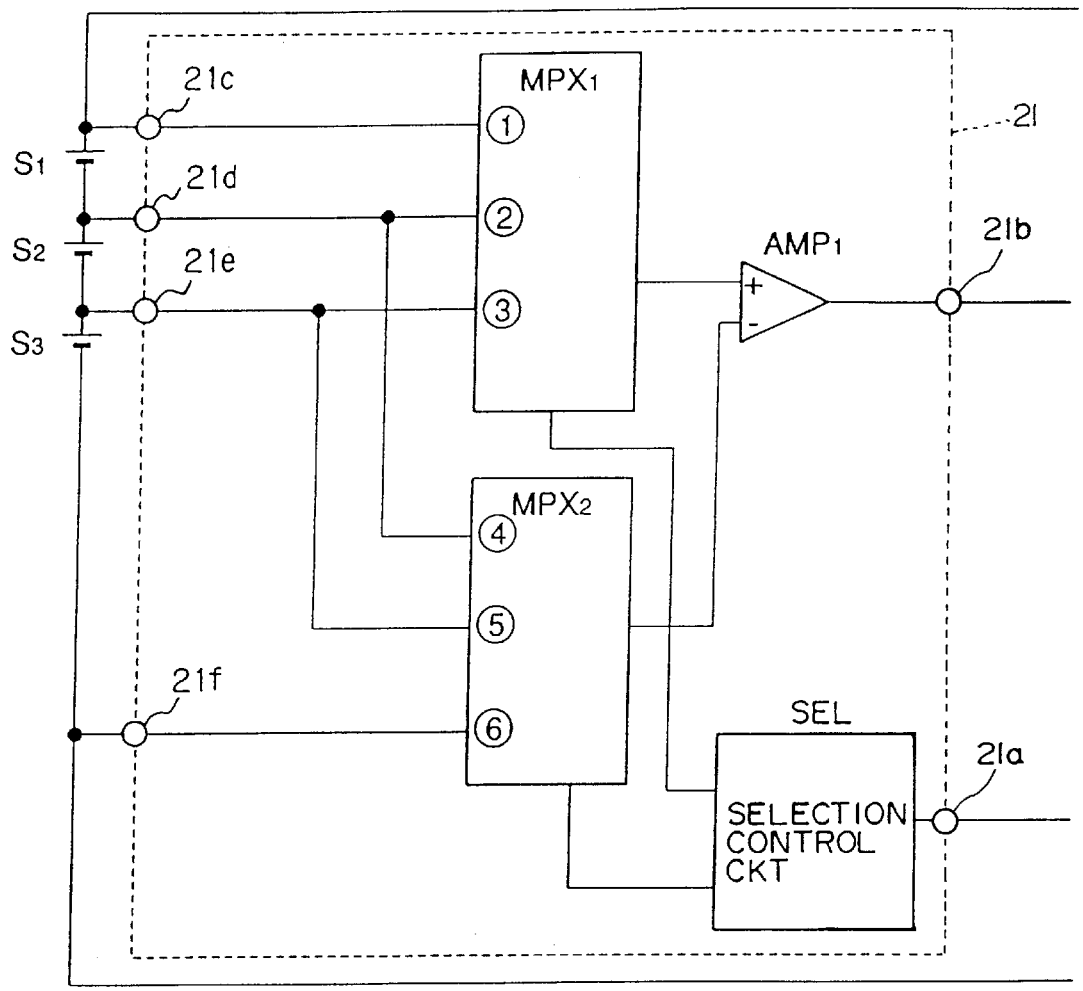
FIG. 2 is a block diagram showing a structure of a battery protection circuit in the first embodiment shown in FIG. 1.
Figure 12:
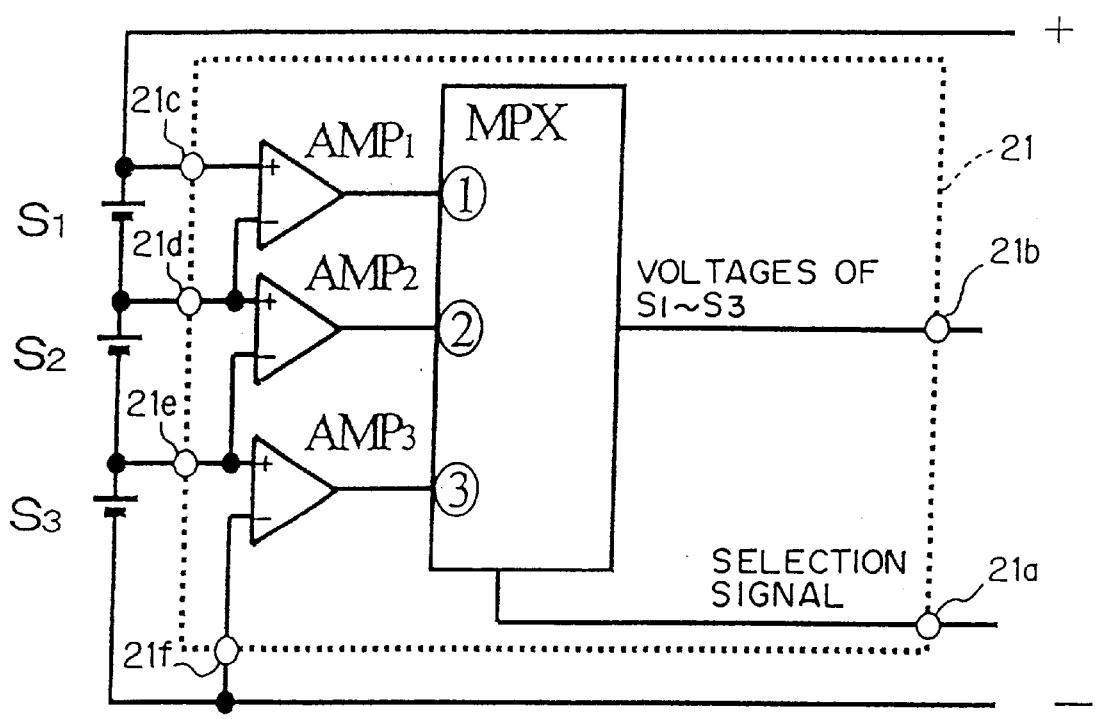
FIG. 12 is a view showing an internal structure of the battery protection circuit of the battery pack shown in FIG. 11.

FIG. 2 is a block diagram showing the structure of the battery protection circuit in the first embodiment shown in FIG. 1. Here, in a similar fashion to that of FIGS. 11 and 12, there will be omitted illustration and explanation of the control circuit for controlling turn-on and turn-off of FETs ($FET_1$ and $FET_2$) for preventing over discharge and over charge prevention, as shown in FIG. 1.

The battery protection circuit 21 shown in FIG. 2 has: a selection signal input terminal 21a connected to a selection signal input terminal 20a of the battery pack 20 shown in FIG. 1; a battery voltage output terminal 21b connected to a battery voltage output terminal 20b of the battery pack 20; four node connection terminals 21c, 21d, 21e and 21f connected to a plurality of nodes (here four nodes) comprising both ends of a plurality (three) of batteries S1, S2 and S3 connected in series and connecting points among the batteries. The battery protection circuit 21 shown in FIG. 2 comprises two multiplexers $MPX_1$ and $MPX_2$, one differential amplifier $AMP_1$, and a selection control circuit SEL.

Voltages of three node connection terminals 21c, 21d and 21e are applied to the first multiplexer $MPX_1$ of the two multiplexers $MPX_1$ and $MPX_2$. The first multiplexer $MPX_1$ selects and outputs one of the three voltages of the three node connection terminals 21c, 21d and 21e in accordance with a selection signal from the selection control circuit SEL. The output voltage thus selected is fed to the differential amplifier $AMP_1$.

Voltages of three node connection terminals 21d, 21e and 21f are applied to the second multiplexer $MPX_2$ of the two multiplexers $MPX_1$ and $MPX_2$. The second multiplexer $MPX_2$ selects and outputs one of the three voltages of the three node connection terminals 21d, 21e and 21f in accordance with a selection signal from the selection control circuit SEL. The output voltage thus selected is fed to the differential amplifier $AMP_1$.

The differential amplifier $AMP_1$ performs an arithmetic operation as to a difference voltage between voltages outputted from the two multiplexers $MPX_1$ and $MPX_2$, and outputs the difference voltage. The difference voltage is transferred via the battery voltage output terminal 21b, the battery voltage output terminal 20b of the battery pack 20, and the battery voltage input terminal 30b of the battery voltage monitor section 30 to the microcomputer 32 so as to produce digital data representative of the difference voltage.

The selection control circuit SEL selects either of the two multiplexers $MPX_1$ and $MPX_2$ in accordance with the selection signal outputted from the microcomputer 32 of the battery voltage monitor section 30 (cf. FIG. 1) and fed via the selection signal output terminal 30$a$, the selection signal input terminal 20$a$ and the selection signal input terminal 21$a$ of the battery protection circuit 21.

Here, as will be described later, there are provided a change-over mode wherein when the multiplexer $MPX_1$ outputs a voltage of the node connection terminal 21$c$, the multiplexer $MPX_2$ outputs a voltage of the node connection terminal 21$d$ (in this case, the differential amplifier $AMP_1$ outputs the voltage of the battery $S_1$, but including an error due to the offset value α of the differential amplifier $AMP_1$. This is the same hereinafter.), a change-over mode wherein when the multiplexer $MPX_1$ outputs a voltage of the node connection terminal 21$d$, the multiplexer $MPX_2$ outputs a voltage of the node connection terminal 21$e$ (in this case, the differential amplifier $AMP_1$ outputs the voltage of the battery $S_2$.), a change-over mode wherein when the multiplexer $MPX_1$ outputs a voltage of the node connection terminal 21$e$, the multiplexer $MPX_2$ outputs a voltage (the earth voltage=0.0V) of the node connection terminal 21$f$ (in this case, the differential amplifier $AMP_1$ outputs the voltage of the battery $S_3$.), and a change-over mode wherein when the multiplexer $MPX_1$ outputs a voltage of the node connection terminal 21$c$, the multiplexer $MPX_2$ outputs a voltage of the node connection terminal 21$e$ (in this case, the differential amplifier $AMP_1$ outputs the voltage between both ends of the batteries $S_1$ and $S_2$ connected in series.

Figure 3:
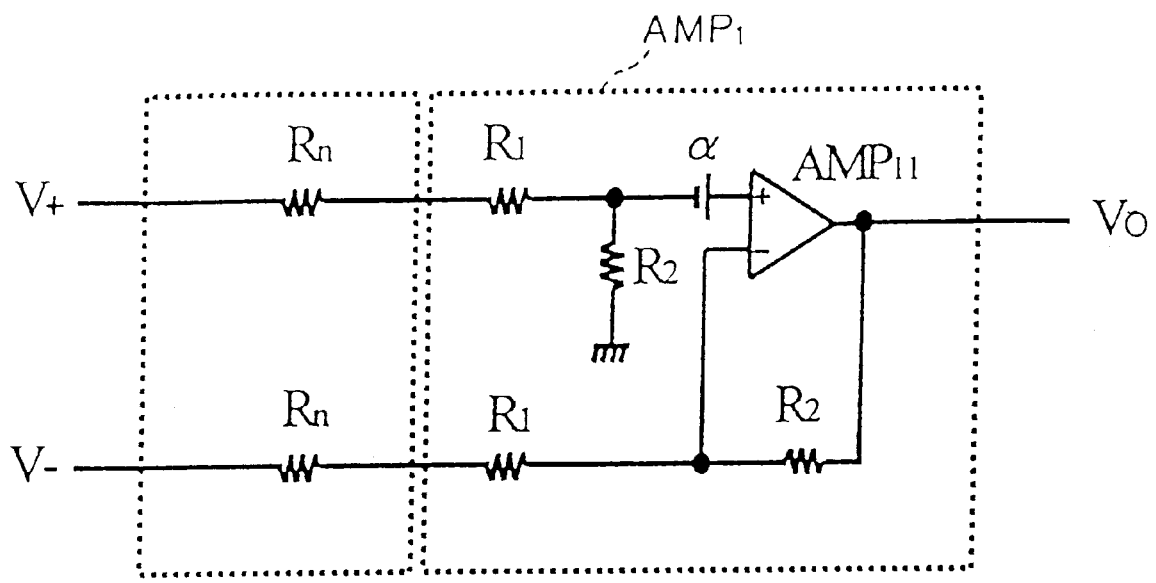
FIG. 3 is a view showing a differential amplifier $AMP_1$ shown in FIG. 2 and ON resistances $R_n$ of two multiplexers $MPX_1$ and $MPX_2$ shown in FIG. 2.

FIG. 3 is a view showing a differential amplifier $AMP_1$ shown in FIG. 2 and ON resistances $R_n$ of two multiplexers $MPX_1$ and $MPX_2$ shown in FIG. 2.

In case of the structure shown in FIG. 3, the output voltage $V^0$ from the differential amplifier $AMP_1$ is expressed by the following equation.

$$V^0 = (R_2/(R_1+R_n)) \times (V^+ - V^-) + ((R_1+R_2)/R_2) \times \alpha \quad (4)$$

While ON resistances $R_n$ of the multiplexers $MPX_1$ and $MPX_2$ are 100Ω–200Ω or so, the resistances $R_1$ and $R_2$ of the differential amplifier $AMP_1$ are each 200 kΩ or so. Consequently, an effect of the ON resistances $R_n$ is not much than 0.1%, and thus it is possible to neglect the effect of the ON resistances $R_n$.

Figure 4:
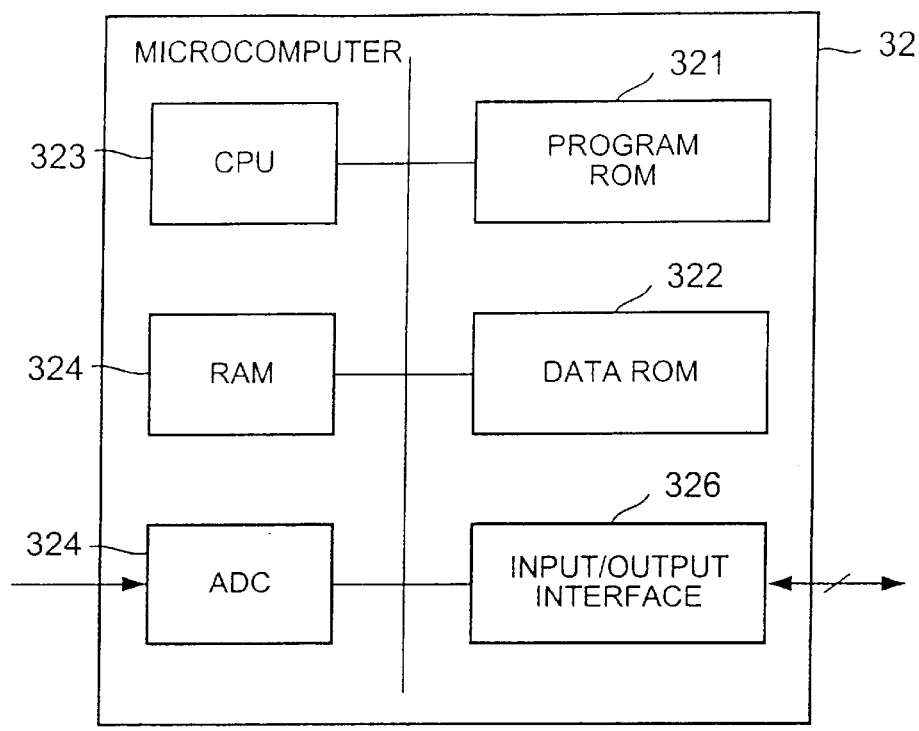
FIG. 4 is a schematic construction view of a microcomputer shown in FIG. 1.

FIG. 4 is a schematic construction view of the microcomputer 32 shown in FIG. 1.

Figure 14:
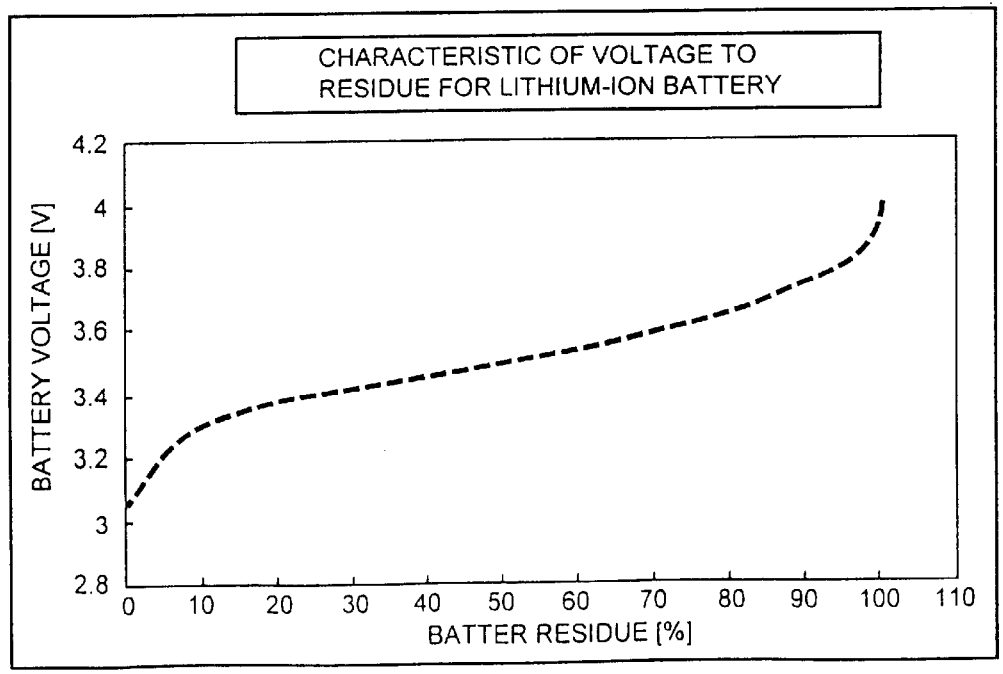
FIG. 14 is a graph showing a relation between a battery voltage (a vertical axis) and a battery residue (a horizontal axis) of a lithium-ion battery.
Figure 15:
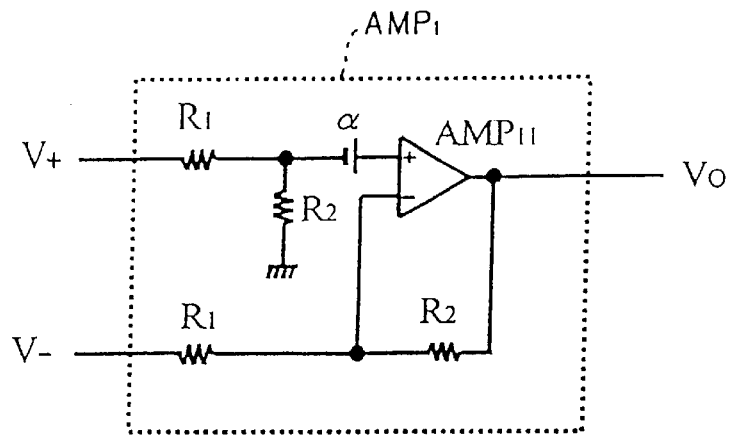
FIG. 15 is a circuit diagram showing one (here, the differential amplifier $AMP_1$) of three differential amplifiers $AMP_1$, $AMP_2$ and $AMP_3$ shown in FIG. 12.
Figure 16:
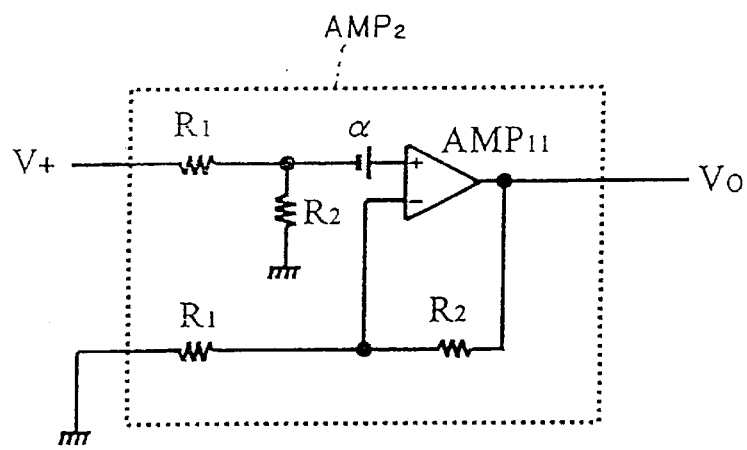
FIG. 16 is a circuit diagram which is modified in the point that the inverting input of the differential amplifier shown in FIG. 15 is grounded.
Figure 17:
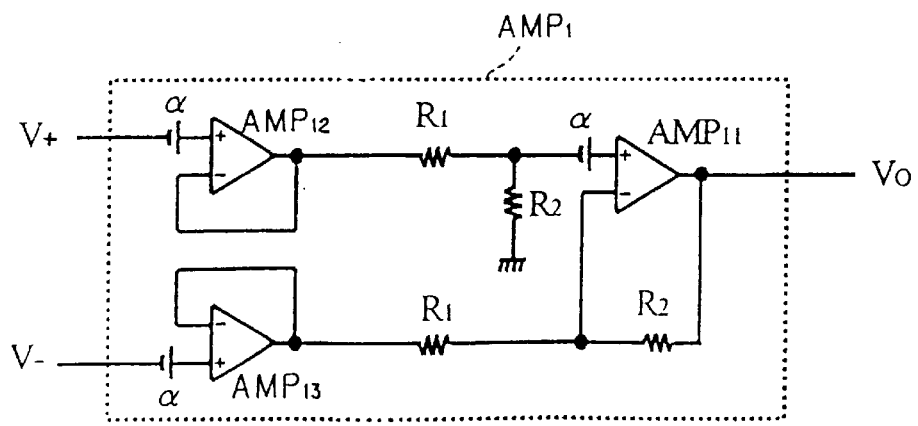
FIG. 17 is a circuit diagram which is modified in the point that in the preceding stage of the differential amplifier shown in FIG. 15, there are provided differential amplifier $AMP_{12}$ and differential amplifier $AMP_{13}$ which serve as a buffer.

The microcomputer 32 comprises: a program ROM 321 for storing a program; a data ROM 322 for storing, for example, data representative of the association between the battery voltage and the battery residue, as shown in FIG. 14, and other various types of data; a CPU 323 for reading and executing the program stored in the program ROM 321; a RAM 324 serving as a work area when the CPU 323 executes the program; an A/D converter 325 for converting an input analog voltage into digital data; and an input and output interface 326 for inputting and outputting digital signals. The input and output interface 326 outputs a selection signal to change over two multiplexers $MPX_1$ and $MPX_2$ shown in FIG. 2. The A/D converter 325 converts the output of the differential amplifier $AMP_1$ shown in FIG. 2 into digital data.

Figure 5:
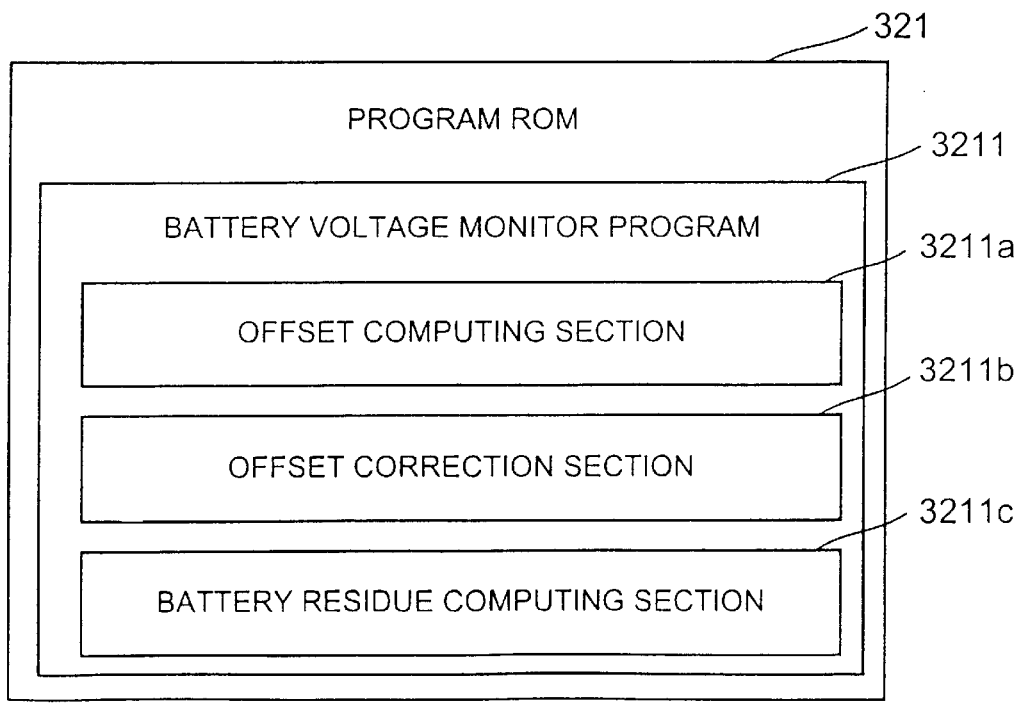
FIG. 5 is a conceptual view of a program stored in a program ROM constituting the microcomputer shown in FIG. 4.

FIG. 5 is a conceptual view of a program stored in the program ROM 321 constituting the microcomputer 32 shown in FIG. 4.

The program ROM 321 stores therein a battery voltage monitor program 3211. The battery voltage monitor program 3211 comprises an offset computing section 3211$a$, an offset correction section 3211$b$ and a battery residue computing section 3211$c$. Processing contents of the battery voltage monitor program will be explained referring to FIG. 6 hereinafter.

Figure 6:
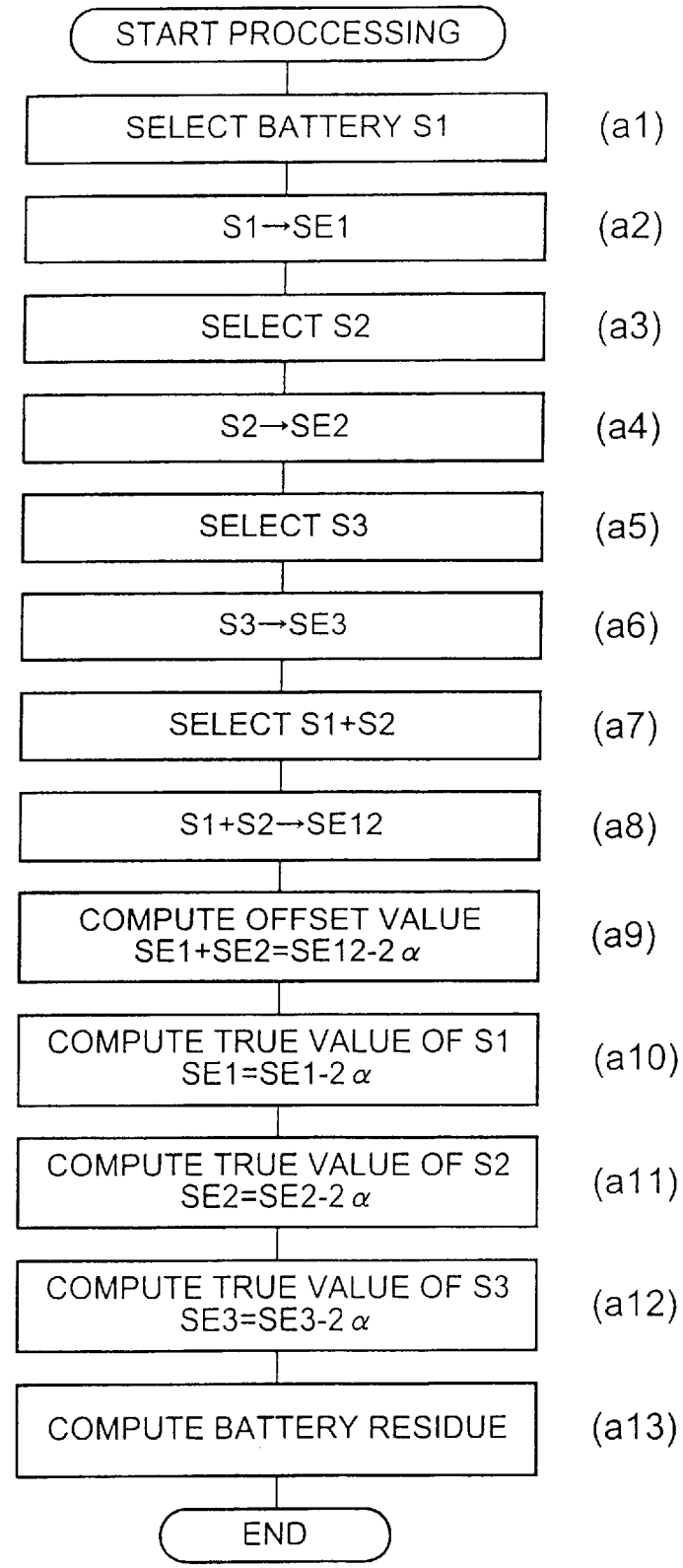
FIG. 6 is a flowchart useful for understanding processing contents of a battery voltage monitor program stored in a program ROM of a microcomputer.

FIG. 6 is a flowchart useful for understanding processing contents of the battery voltage monitor program stored in the program ROM 321 of the microcomputer 32.

In the microcomputer 32 shown in FIGS. 1 and 4, when the execution of the battery voltage monitor program shown in FIG. 6 is started, first, in step (a1), the microcomputer 32 outputs the selection signal to select the battery $S_1$, and the selection control circuit SEL of the battery protection circuit 21 shown in FIG. 2 outputs to two multiplexers $MPX_1$ and $MPX_2$ change-over signals so that the differential amplifier $AMP_1$ outputs the voltage of the battery $S_1$. The multiplexers $MPX_1$ and $MPX_2$ change over the associated inputs in accordance with the change-over signals and output the selected inputs to the differential amplifier $AMP_1$, respectively. Specifically, the first multiplexer $MPX_1$ is changed over in accordance with the selection signal to select the battery $S_1$ in such a manner that the voltage of the node connection terminal 21$c$ is transmitted to the differential amplifier $AMP_1$. And the second multiplexer $MPX_2$ is changed over in such a manner that the voltage of the node connection terminal 21$d$ is transmitted to the differential amplifier $AMP_1$.

When the two multiplexers $MPX_1$ and $MPX_2$ are changed over in such a manner as mentioned above, the differential amplifier $AMP_1$ outputs the voltage of the battery $S_1$. The voltage of the battery $S_1$ is transmitted to the microcomputer 32. In step (a2) of FIG. 6, the voltage of the battery $S_1$ is converted into digital data and then read by the microcomputer 32. Here, the read voltage (read value) of the battery $S_1$ is denoted by SE1.

In steps (a3) and (a4), in a similar fashion to that of the steps (a1) and (a2) mentioned above, the microcomputer 32 outputs the selection signal to select the battery $S_2$, and reads the voltage of the battery $S_2$. Here, the read voltage (read value) of the battery $S_2$ is denoted by SE2.

In steps (a5) and (a6), also in a similar fashion to that of the above-mentioned steps, the microcomputer 32 outputs the selection signal to select the battery $S_3$, and reads the voltage of the battery $S_3$. Here, the read voltage (read value) of the battery $S_3$ is denoted by SE3.

In steps (a7) and (a8), also in a similar fashion to that of the above-mentioned steps, the microcomputer 32 outputs the selection signal to select two batteries $S_1$ and $S_2$ connected in series, and reads the voltage between both ends of the batteries $S_1$ and $S_2$ connected in series. Here, the read voltage (read value) is denoted by SE12.

In step (a9), the above-mentioned read values are used to determine the offset voltage α of the differential amplifier $AMP_1$ in accordance with the following equation (5).

$$SE1 + SE2 = SE12 - 2\alpha \quad (5)$$

Here, there will be explained the reason why the offset voltage α can be determined in accordance with the equation (5).

Now, it is assumed that in the differential amplifier $AMP_1$ shown in FIG. 3, the ON resistances $R_n$ of two multiplexers $MPX_1$ and $MPX_2$ are negligible by the reason as mentioned above, and two resistances $R_1$ and $R_2$ have the same resistance value.

In this condition, the equation (4) is expressed by the following equation (6).

$$V^0 = V^+ - V^- + 2\alpha \qquad (6)$$

When the true voltage values of the batteries $S_1$, $S_2$ and $S_3$ are denoted by S1, S2, S3, the read values SE1, SE2 and SE12 read in the steps (a2), (a4) and (a8) are expressed by the following equations.

$$SE1 = S1 + 2\alpha \qquad (7)$$

$$SE2 = S2 + 2\alpha \qquad (8)$$

$$SE12 = S1 + S2 + 2\alpha \qquad (9)$$

Consequently, $$SE1 + SE2 = S1 + 2\alpha + S2 + 2\alpha$$
$$= S1 + S2 + 4\alpha$$
$$= SE12 + 2\alpha$$

Thus, the equation (5) is applied.

Consequently, the offset voltage $\alpha$ of the differential amplifier $AMP_1$ is determined in accordance with the following equation (10).

$$\alpha = (SE1 + SE2 - SE12)/2 \qquad (10)$$

According to the present embodiment, the assembly of steps up to the determination of the offset voltage $\alpha$ of the differential amplifier $AMP_1$, that is, the assembly of the steps (a1) to (a9,) is referred to as the offset computing section 3211a of the battery voltage monitor program 3211 shown in FIG. 5.

Next, in steps (a10) to (a12) of FIG. 6, the true voltage values $S_1$, $S_2$ and $S_3$ of the batteries $S_1$, $S_2$ and $S_3$ are determined by the following equations.

$$S1 = SE1 - 2\alpha \qquad (11)$$

$$S2 = SE2 - 2\alpha \qquad (12)$$

$$S3 = SE3 - 2\alpha \qquad (13)$$

According to the present embodiment, the assembly of the steps (a10) to (a12) is referred to as the offset correction section 3211b of the battery voltage monitor program 3211 shown in FIG. 5.

In step (a13) of FIG. 6, a residue of each of the batteries $S_1$, $S_2$ and $S_3$ are computed. To compute the residue of the batteries, the association data between the battery voltage and the battery residue shown in FIG. 14 by way of example, which is stored in the data ROM 322 of the microcomputer 32 shown in FIG. 4, is referred to, and the true voltage values $S_1$, $S_2$ and $S_3$ of the batteries $S_1$, $S_2$ and $S_3$, which are determined in the steps (a10) to (a12), are converted into the battery residues. The battery residues thus computed are transmitted from the microcomputer 32 to the main frame of the notebook-sized personal computer 40 (cf. FIG. 1). The notebook-sized personal computer 40 displays on a display screen (not illustrated) the battery residue, or in the event that the battery residue is few, displays such a matter. Incidentally, in the step (a13) if FIG. 6, while it is usual that the approximately same battery residue is detected on the batteries $S_1$, $S_2$ and $S_3$, in the event that only one of those batteries $S_1$, $S_2$ and $S_3$ is extremely less in the battery residue, an earlier alarm display is issued and an exchange of the battery pack is urged. The step (a13) of FIG. 6 corresponds to the battery residue computing section 3211c of the battery voltage monitor program 3211.

As mentioned above, according to the present embodiment, in the event that the battery residue is determined, the offset voltage $\alpha$ of the differential amplifier $AMP_1$ is detected, and the true battery voltage, which is corrected in the offset voltage $\alpha$, is determined. Thus, it is possible to determine the battery residue with great accuracy, and thereby performing a display of the battery residue with great accuracy.

Figure 7:
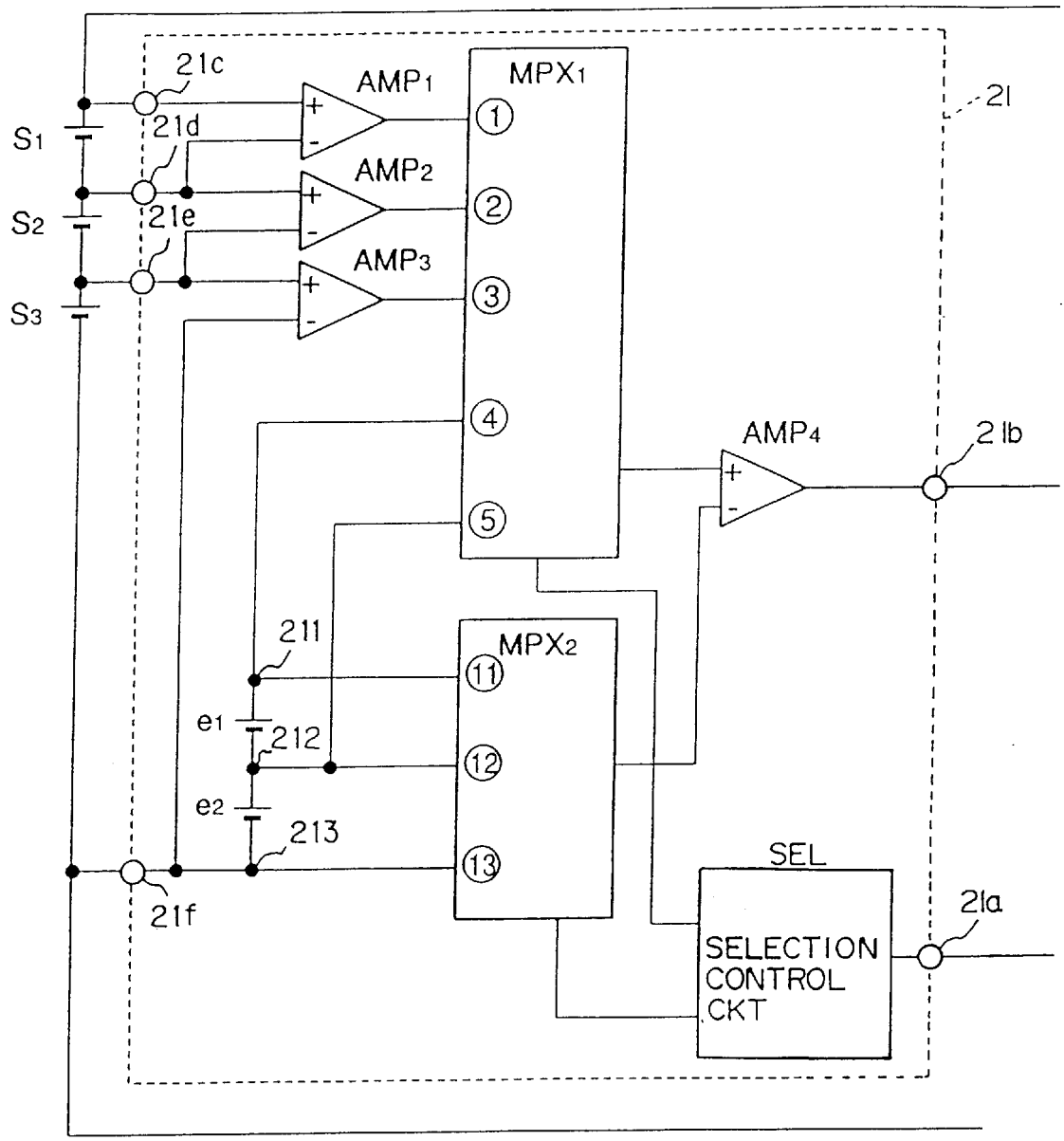
FIG. 7 is a block diagram showing a structure of a battery protection circuit in the second embodiment of the present invention.

FIG. 7 is a block diagram showing a structure of a battery protection circuit in the second embodiment of the present invention. The structure of the battery system in its entirety according to the second embodiment of the present invention is the same as that according to the first embodiment of the present invention. Thus, the illustration of the structure of the battery system in its entirety in form of the second embodiment is omitted, and FIG. 1 will be referred. But in the second embodiment, it is different from the first embodiment in the point that the DC-DC converter circuit 31 shown in FIG. 1 converts the battery voltage to 3.0V, and the microcomputer 32 is operative on 3.0V. Further, in FIG. 7, in a similar fashion to that of FIG. 2, there are omitted illustration and explanation as to the structure for controlling FETs ($FET_1$ and $FET_2$) for preventing over discharge and over charge prevention, as shown in FIG. 1.

A battery protection circuit 21 shown in FIG. 7 has the same terminals 21a to 21f as the battery protection circuit 21 shown in FIG. 2, but is different in the internal structure from the battery protection circuit 21 shown in FIG. 2. The battery protection circuit 21 shown in FIG. 7 comprises four differential amplifiers $AMP_1$, $AMP_2$, $AMP_3$ and $AMP_4$, two reference voltage sources e1 and e2 connected in series, two multiplexers $MPX_1$ and $MPX_2$, and a selection control circuit SEL. The battery protection circuit 21 is made in its entirety into an LSI. Accordingly, the four differential, amplifiers $AMP_1$, $AMP_2$, $AMP_3$ and $AMP_4$ have the same characteristics including voltage values (offset values) of offset voltages with sufficient great accuracy.

Of the four differential amplifiers $AMP_1$, $AMP_2$, $AMP_3$ and $AMP_4$, three differential amplifiers $AMP_1$, $AMP_2$ and $AMP_3$ except the differential amplifier $AMP_4$ are connected in their two inputs with two node connection terminals 21c and 21d, two node connection terminals 21d and 21e and two node connection terminals 21e and 21f, respectively, and outputs of the three differential amplifiers are fed to the first multiplexer $MPX_1$.

Further fed to the first multiplexer $MPX_1$ are voltages of two nodes of a node 211 of the e1 side of the two reference voltage sources e1 and e2 connected in series, and a node 212 of the connecting point between the two reference voltage sources e1 and e2.

Fed to the second multiplexer $MPX_2$ are voltages of total three nodes of nodes 211 and 213 of both sides of the two reference voltage sources e1 and e2 connected in series, and the node 212 of the connecting point between the two reference voltage sources e1 and e2. The node 213 of the e2 side of the two reference voltage sources e1 and e2 is connected to the second multiplexer $MPX_2$ in the condition that the node 213 is connected to the node connection terminal 21f.

Fed to the remaining differential amplifier $AMP_4$ are outputs of the two multiplexers $MPX_1$ and $MPX_2$ to determine a difference between the outputs of the two multiplexers. The difference thus determined is outputted from the monitor signal output terminal 21b to the microcomputer 32 (cf. FIG. 1).

The selection control circuit SEL shown in FIG. 7 controls, in similar fashion to the selection control circuit SEL shown in FIG. 2, the change over of the two multiplexers $MPX_1$ and $MPX_2$ in accordance with the selection signal transmitted from the microcomputer 32, but it is different from the case of FIG. 2 in change-over mode.

That is, here, there are provided: a change-over mode wherein a change-over is performed in such a manner that in a timing that the first multiplexer $MPX_1$ outputs a voltage of the node 211 of the reference voltage source e1 side of the three nodes 211, 212 and 213 of the two reference voltage sources e1 and e2 connected in series, the second multiplexer $MPX_2$ outputs a voltage of the node 212 of the connecting point between the two reference voltage sources e1 and e2 (in this case, the differential amplifier $AMP_4$ outputs the voltage of the reference voltage source e1); a change-over mode wherein a change-over is performed in such a manner that in a timing that the first multiplexer $MPX_1$ outputs a voltage of the node 212 of the connecting point between the two reference voltage sources e1 and e2, the second multiplexer $MPX_2$ outputs a voltage of the node 213 of the reference voltage source e2 side (in this case, the differential amplifier $AMP_1$ outputs the voltage of the reference voltage source e2 ); a change-over mode wherein a change-over is performed in such a manner that in a timing that the first multiplexer $MPX_1$ outputs a voltage of the node 211 of the reference voltage source e2, the second multiplexer $MPX_2$ outputs a voltage of the node 213 of the reference voltage source e2 side (in this case, the differential amplifier $AMP_1$ outputs the voltage between both ends of the two reference voltage sources e1 and e2 connected in series); a change-over mode wherein a change-over is performed in such a manner that in a timing that the second multiplexer $MPX_2$ outputs a voltage of the node 211 of the reference voltage source e1 side, the first multiplexer $MPX_1$ outputs an output (a voltage of the battery S1) of the differential amplifier $AMP_1$ (in this case, the differential amplifier $AMP_1$ outputs a difference voltage wherein a voltage (a slice voltage) due to the reference voltage sources e1 and e2 connected in series is subtracted from the voltage of the battery S1); a change-over mode wherein a change-over is performed in such a manner that the second multiplexer $MPX_2$ outputs the slice voltage, and the first multiplexer $MPX_1$ outputs an output (a voltage of the battery S2) of the differential amplifier $AMP_2$ (in this case, the differential amplifier $AMP_1$ outputs a difference voltage wherein the slice voltage is subtracted from the voltage of the battery S2); and a change-over mode wherein a change-over is performed in such a manner that the second multiplexer $MPX_2$ outputs the slice voltage, and the first multiplexer $MPX_1$ outputs an output (a voltage of the battery S3) of the differential amplifier $AMP_3$ (in this case, the differential amplifier $AMP_4$ outputs a difference voltage wherein the slice voltage is subtracted from the voltage of the battery S3).

Figure 13:
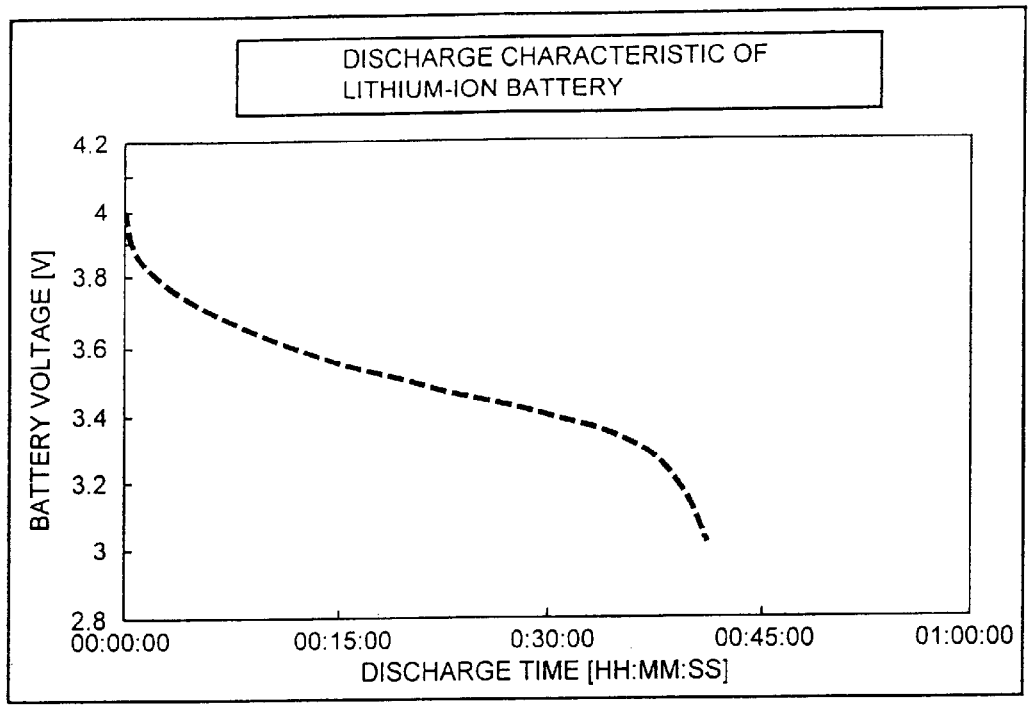
FIG. 13 is a graph showing a relation between a discharge time (a horizontal axis) and a battery voltage (a vertical axis) of a lithium-ion battery.

The microcomputer 32 (cf. FIG. 1) in the second embodiment is operative on 3.0V, while the voltages of the batteries S1, S2 and S3 are 4.0V or so in the complete charge state as shown in FIG. 13. Consequently, a difference voltage, wherein the slice voltage is subtracted from the voltages of the batteries S1, S2 and S3, is transmitted to the microcomputer 32 so that the microcomputer 32 can recognize the voltages of the batteries S1, S2 and S3. At that time, in a similar fashion to that of the first embodiment, accuracy of the slice voltage, which is generated by the two reference voltage sources e1 and e2, as well as the offset voltage $\alpha$ of the differential amplifiers $AMP_1$ to $AMP_4$ becomes a problem. In this respect, according to the second embodiment, the offset voltage $\alpha$ of the differential amplifiers $AMP_1$ to $AMP_4$ and the slice voltage are exactly measured in accordance with the following way, and the measured voltages are reflected on the measured values of the respective difference voltages in which the slice voltage is subtracted from the voltages of the batteries S1, S2 and S3, so that the true voltage values of the batteries S1, S2 and S3 can be determined.

Figure 8:
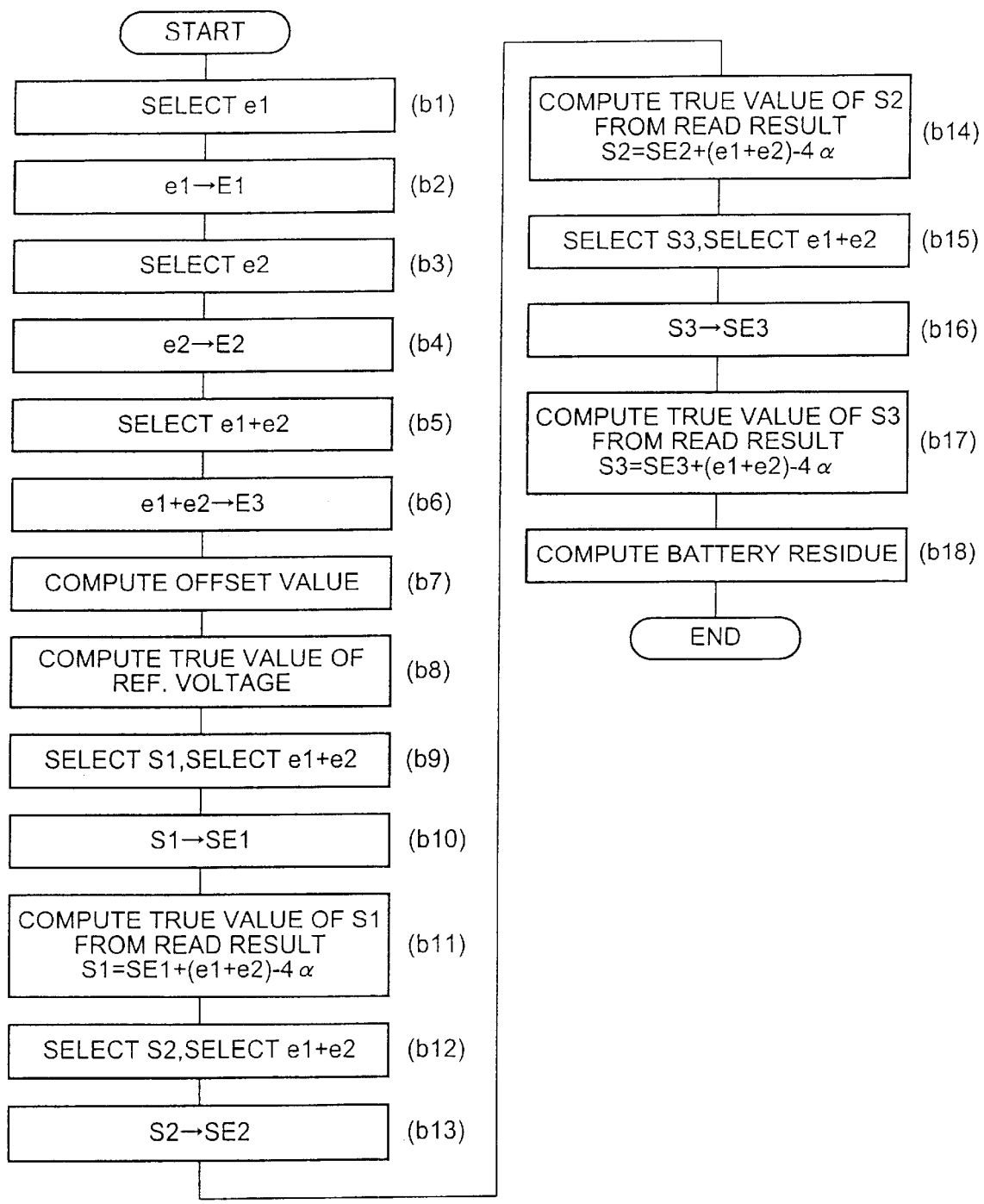
FIG. 8 is a flowchart useful for understanding a battery voltage monitor program to be executed by a microcomputer, in the second embodiment of the present invention.

FIG. 8 is a flowchart useful for understanding a battery voltage monitor program to be executed by the microcomputer 32, in the second embodiment of the present invention.

First, in step (b1), the microcomputer 32 outputs the selection signal to select the reference voltage e1 to the battery protection circuit 21 shown in FIG. 7, of the battery pack 20 shown in FIG. 1. In the battery protection circuit 21, the selection control circuit SEL changes over the two multiplexers $MPX_1$ and $MPX_2$ so that the multiplexers $MPX_1$ and $MPX_2$ output the voltages of the node 211 and the node 212, respectively, and the differential amplifier $AMP_4$ outputs the voltage of the reference voltage source e1. The voltage of the reference voltage source e1 outputted from the differential amplifier $AMP_4$ is transmitted to the microcomputer 32. In step (b2), the voltage of the reference voltage source e1 is subjected to the AD conversion so that the voltage value is read in form of digital data by the microcomputer 32. Here, the read value of the reference voltage source e1 is denoted by E1.

Next, in a similar fashion to that of the above, in steps (b3) and (b4), the reference voltage source e2 is selected and the read value E2 is read.

Further, in a similar fashion to that of the above, in steps (b5) and (b6), the voltage on both ends of the two reference voltage sources e1 and e2 connected in series is selected and the read value E3 of the voltage on both the ends is read.

Thereafter, in step (b7), the offset value $\alpha$ of the differential amplifier $AMP_4$ is determined in accordance with the following equation (14).

$$E1+E2=E3-2\times\alpha \qquad (14)$$

Here, the read values E1 and E2 of the reference voltage sources e1 and e2, and the read value E3 of the voltage on both the ends of the two reference voltage sources e1 and e2 connected in series are expressed, from the equation (6), as follows.

$$E1=e1+2\alpha \qquad (15)$$

$$E2=e2+2\alpha \qquad (16)$$

$$E3=e1+e2+2\alpha \qquad (17)$$

Where the true voltage values of the two reference voltage sources e1 and e2 are denoted by e1 and e2, respectively.

Consequently, $$E1+E2 = e1+2\alpha+e2+2\alpha$$
$$= e1+e2+4\alpha$$
$$= E3+2\alpha$$

thus, the equation (14) is applied.

Accordingly, from the equation (14), the offset value $\alpha$ of the differential amplifier $AMP_4$ is determined in accordance with the following equation (18).

$$\alpha=(E1+E2-E3)/2 \qquad (18)$$

When the offset value $\alpha$ is determined, the true slice voltage (e1+e2) is determined, from the equation (17), in accordance with the following equation (19) (step (b8)).

$$e1+e2=E3-2\alpha \tag{19}$$

In the second embodiment, the steps (b1) to (b8) of FIG. 8, which perform the above-mentioned processing, correspond to the offset computing section 3211a of the battery voltage monitor program 3211 shown in FIG. 5.

Next, in step (b9) of the flowchart shown in FIG. 8, a selection signal is transmitted in such a manner that the voltage (the output of the differential amplifier $AMP_1$) of the battery S1 is outputted from the multiplexer $MPX_1$, and the slice voltage (the voltage of the node 211) is outputted from the multiplexer $MPX_2$. Then the read value SE1 of the difference voltage between the voltage of the battery S1 and the slice voltage is fed to the microcomputer 32 (step (b10)). From the result, the true voltage value S1 of the battery S1 is computed in accordance with the following equation (20) (step (b11)).

$$S1=SE1+(e1+e2)-4\alpha \tag{20}$$

The equation (20) can be derived as follows. When the offset value of the differential amplifier $AMP_1$ is denoted by $\alpha_1$, and the offset value of the differential amplifier $AMP_4$ is denoted by $\alpha_4$, the following equation is given.

$$\begin{aligned}SE1 &= (S1+2\times\alpha_1)-(e1+e2)+2\times\alpha_4\\&= S1-(e1+e2)+2\alpha_1+2\alpha_4\end{aligned} \tag{21}$$

The elements constituting the battery protection circuit 21 is loaded on one LSI chip, as mentioned above, and thus the offset values of the differential amplifiers $AMP_1$ to $AMP_4$ are mutually the same, and when the offset values are denoted by $\alpha$, the equation (21) is expressed by the following equation (22).

$$SE1=S1-(e1+e2)+4\alpha \tag{22}$$

Thus, the equation (20) is applied.

Similarly, in steps (b12), (b13) and (b14), the read value SE2 of the difference voltage, wherein the slice voltage is subtracted from the voltage of the battery S2, is read, and the true voltage value S2 of the battery S2 is determined in accordance with equation (23)

$$S2=SE2+(e1+e2)-4\alpha \tag{23}$$

Further, similarly, in steps (b15), (b16) and (b17), the read value SE3 of the difference voltage, wherein the slice voltage is subtracted from the voltage of the battery S3, is read, and the true voltage value S3 of the battery S3 is determined in accordance with equation (24)

$$S3=SE3+(e1+e2)-4\alpha \tag{24}$$

The processing for determining the true voltage values S1, S2 and S3 of the batteries S1, S2 and S3 in the steps (b9)–(b17) correspond to the offset correction section 3211b of the battery voltage monitor program 3211 shown in FIG. 5.

In steps (b18), the true voltage values of the batteries S1, S2 and S3 are converted into the battery residues. This conversion method is similar to that of the above-mentioned first embodiment (the step (a13) of FIG. 6), and thus the redundant description will be omitted. This step (b18) correspond to the battery residue computing section 3211c of the battery voltage monitor program 3211 shown in FIG. 5.

Figure 9:
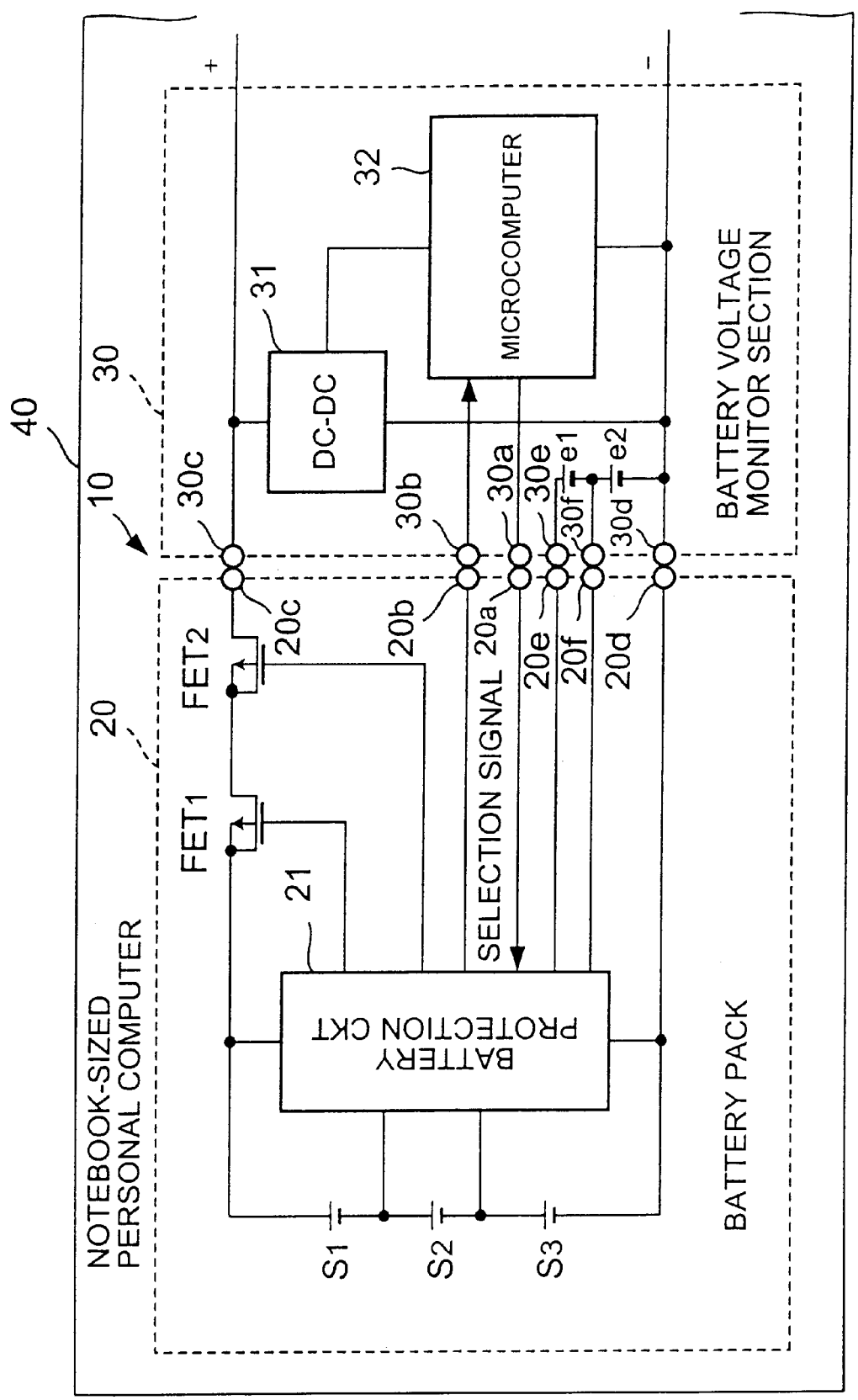
FIG. 9 is a block diagram showing a structure of a third embodiment of the present invention.

FIG. 9 is a block diagram showing a structure of a third embodiment of the present invention.

The third embodiment shown in FIG. 9 is the same as the second embodiment shown in FIGS. 1, 7 and 8, except the different points which will be described hereinafter, and the redundant description will be omitted.

According to the second embodiment, the reference voltage sources e1 and e2 are provided within the battery pack 20 (specifically inside the battery protection circuit 21 shown in FIG. 7). On the other hand, according to the third embodiment shown in FIG. 9, the reference voltage sources e1 and e2 are provided outside the battery pack 20 (for example, inside the battery voltage monitor section 30). For this reason, the battery pack 20 is provided with terminals 20e, 20f and 20d to be connected to nodes of two reference voltage sources e1 and e2 which are connected in series. Voltages on the nodes are transferred via terminals 30e, 30f and 30d of the battery voltage monitor section 30 and the terminals 20e, 20f and 20d of the battery pack 20 to the battery protection circuit 21 of the battery pack 20.

In this manner, it is acceptable that the reference voltage sources e1 and e2 are provided outside the battery pack 20, and the battery pack 20 is provided with terminals to be connected to the nodes of the reference voltage sources e1 and e2. The third embodiment is the same as the second embodiment except for the point that the reference voltage sources e1 and e2 are provided outside the battery pack 20, and thus the redundant explanation will be omitted.

Figure 10:
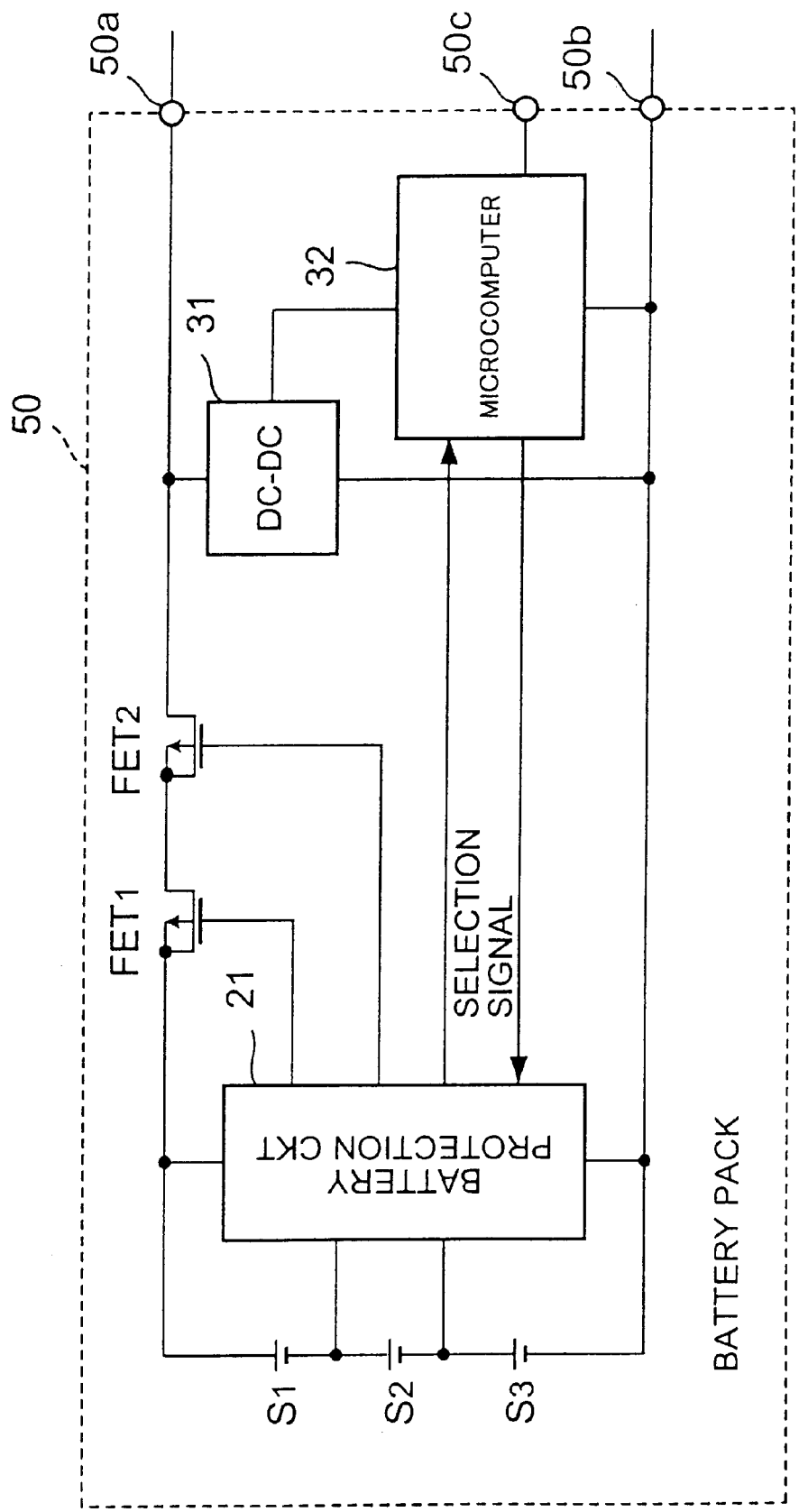
FIG. 10 is a block diagram showing a structure of a fourth embodiment of the present invention.

FIG. 10 is a block diagram showing a structure of a fourth embodiment of the present invention.

FIG. 10 shows a battery pack 50 which incorporates therein to the structural elements of both the battery pack 20 and the battery voltage monitor section 30 shown in FIG. 1. Thus, the battery pack 50 are provided with terminals 50a and 50b for outputting from the battery pack 50 voltages on both ends of three batteries S1, S2 and S3 connected in series, and a terminal 50c for transmitting data concerning the battery residue determined by the microcomputer 32 and for performing a transfer of data between the microcomputer 32 and the exterior.

It is acceptable that a battery protection circuit 21, a DC-DC conversion circuit 31 and a microcomputer 32 of the battery pack 50 have the same functions of the associated elements in the first embodiment, respectively, or alternatively have the same functions of the associated elements in the second embodiment, respectively.

In this manner, it is acceptable that the battery pack of the present invention is provided with such an intelligent function that a battery voltage is monitored to determine a battery residue.

As mentioned above, according to the present invention, it is possible to monitor a battery voltage with great accuracy. Further, of the present inventions, the invention belong to the second group is to directly monitor a difference voltage between a battery voltage and a slice voltage. This feature makes it possible to monitor with great accuracy, even if a monitor circuit is a circuit which is operative on a power supply voltage lower than a voltage of a battery to be monitored.

While the present invention has been described with reference to the particular illustrative embodiments, it is not to be restricted by those embodiments but only by the appended claims. It is to be appreciated that those skilled in the art can change or modify the embodiments without departing from the scope and sprit of the present invention.

What is claimed is:

1. A monitor signal output circuit comprising:

a differential amplifier for monitoring signal output; and a change-over circuit for changing over a connection between a plurality of batteries connected in series and an input of said differential amplifier in accordance with a selection signal so that said differential amplifier outputs a signal according to the selection signal of a plurality of signals including signals representative of voltages of the plurality of batteries and a voltage of a series combination of a predetermined two or more batteries.

2. A battery pack incorporating a plurality of batteries connected in series, and a monitor signal output circuit having a differential amplifier which outputs a signal selected in accordance with a selection signal of a plurality of signals including signals representative of voltages of the plurality of batteries and a voltage of a series combination of a predetermined two or more batteries.

3. A battery pack incorporating a plurality of batteries connected in series, and a monitor signal output circuit having a differential amplifier which outputs a signal selected in accordance with a selection signal of a plurality of signals including signals representative of voltages of the plurality of batteries and a voltage involved in a combination of predetermined two or more batteries, wherein said battery pack further incorporates a battery voltage monitor circuit having:

an offset computing section for computing an offset voltage of said differential amplifier in accordance with a plurality of signals derived from said monitor signal output circuit; and an offset correction section for correcting measurement errors of voltages of the plurality of batteries using the offset voltage computed in said offset computing section.

4. A battery pack according to claim 3, wherein said offset computing section computes the offset voltage of said differential amplifier in accordance with three signals representative of a first voltage involved in at least one part of battery of the plurality of batteries, a second voltage involved in at least one another part of battery of the plurality of batteries, and a third voltage involved in two or more batteries in combination of said part of battery and said another part of battery.

5. A battery voltage monitor circuit comprising:

an offset computing section for computing an offset voltage of a differential amplifier, which outputs a signal selected in accordance with a selection signal of a plurality of signals including signals representative of voltages of a plurality of batteries connected in series and a voltage involved in a combination of predetermined two or more batteries, in accordance with a plurality of signals derived from a monitor signal output circuit having said differential amplifier; and an offset correction section for correcting measurement errors of voltages of the plurality of batteries using the offset voltage computed in said offset computing section.

6. A battery voltage monitor circuit according to claim 5, wherein said offset computing section computes the offset voltage of said differential amplifier in accordance with three signals representative of a first voltage involved in at least one part of battery of the plurality of batteries, a second voltage involved in at least one another part of battery of the plurality of batteries, and a third voltage involved in two or more batteries in combination of said part of battery and said another part of battery.

7. A battery system comprising:

a plurality of batteries connected in series;

a monitor signal output circuit having a differential amplifier which outputs a signal selected in accordance with a selection signal of a plurality of signals including signals representative of voltages of the plurality of batteries and a voltage involved in a combination of predetermined two or more batteries; and a battery voltage monitor circuit having an offset computing section for computing an offset voltage of said differential amplifier in accordance with a plurality of signals derived from said monitor signal output circuit, and an offset correction section for correcting measurement errors of voltages of the plurality of batteries using the offset voltage computed in said offset computing section.

8. An apparatus operative upon receipt of supply of an electric power, said apparatus comprising:

a plurality of batteries connected in series;

a monitor signal output circuit having a differential amplifier which outputs a signal selected in accordance with a selection signal of a plurality of signals including signals representative of voltages of the plurality of batteries and a voltage involved in a combination of predetermined two or more batteries; and a battery voltage monitor circuit having an offset computing section for computing an offset voltage of said differential amplifier in accordance with a plurality of signals derived from said monitor signal output circuit, and an offset correction section for correcting measurement errors of voltages of the plurality of batteries using the offset voltage computed in said offset computing section.

9. A battery voltage monitor method comprising steps of:

computing an offset voltage of a differential amplifier, which outputs a signal selected in accordance with a selection signal of a plurality of signals including signals representative of voltages of a plurality of batteries connected in series and a voltage involved in a combination of predetermined two or more batteries, in accordance with a plurality of signals derived from a monitor signal output circuit having said differential amplifier; and correcting measurement errors of voltages of the plurality of batteries using the offset voltage computed in said offset computing section.

10. A battery voltage monitor program storage medium storing a battery voltage monitor program which causes a computer to operate as an apparatus for monitoring a voltage of a battery when the battery voltage monitor program is executed in said computer, wherein said battery voltage monitor program storage medium stores the battery voltage monitor program having an offset computing section for computing an offset voltage of a differential amplifier, which outputs a signal selected in accordance with a selection signal of a plurality of signals including signals representative of voltages of a plurality of batteries connected in series and a voltage involved in a combination of predetermined two or more batteries, in accordance with a plurality of signals derived from a monitor signal output circuit having said differential amplifier; and an offset correction section for correcting measurement errors of voltages of the plurality of batteries using the offset voltage computed in said offset computing section.

11. A monitor signal output circuit comprising:

a differential amplifier for monitor signal output; and a change-over circuit for selecting in accordance with a selection signal any one of a plurality of signal pairs consisting of a signal pair representative of voltages on two nodes, which are selected in accordance with the selection signal, of a plurality of nodes consisting of both ends of a plurality of voltage sources connected in series and connecting points of the voltage sources, and a signal pair representative of a voltage of one battery, which is selected in accordance with the selection signal, of a plurality of batteries connected in series and slice voltages on said plurality of voltage sources, said change-over circuit. feeding a selected signal pair to said differential amplifier.

12. A battery pack incorporating a plurality of batteries connected in series, and a monitor signal output circuit having a differential amplifier which outputs a signal selected in accordance with a selection signal of a plurality of signals consisting of a signal representative of a voltage between two nodes, which are selected in accordance with the selection signal, of a plurality of nodes consisting of both ends of a plurality of voltage sources connected in series and connecting points of the voltage sources, and a signal representative of a difference voltage between a voltage of one battery, which is selected from among the plurality of batteries in accordance with the selection signal and slice voltages on said plurality of voltage sources.

13. A battery pack according to claim 12, wherein said battery pack further incorporates said plurality of voltage sources.

14. A battery pack according to claim 12, wherein said plurality of voltage sources are adapted for an external connection, and said battery pack has terminals to which nodes of said plurality of voltage sources are connected.

15. A battery pack according to claim 12, wherein said battery pack further incorporates a battery voltage monitor circuit having:
an offset computing section for computing an offset voltage of said differential amplifier in accordance with a plurality of signals derived from said monitor signal output circuit, each of said plurality of signals being representative of a voltage between nodes in which at least one node is different from another node; and
an offset correction section for correcting measurement errors of voltages of the plurality of batteries in accordance with the signals representative of difference voltages associated with the plurality of batteries, derived from said monitor signal output circuit, and the offset voltage computed in said offset computing section.

16. A battery pack according to claim 15, wherein said offset computing section computes the offset voltage of said differential amplifier in accordance with three signals representative of a first voltage involved in a first voltage source of the plurality of voltage sources, a second voltage involved in a second voltage source of the plurality of voltage sources, and a third voltage involved in a voltage source in combination of said first voltage source and said second voltage source.

17. A battery voltage monitor circuit comprising:
an offset computing section for computing an offset voltage of a differential amplifier, which outputs a signal selected in accordance with a selection signal of a plurality of signals consisting of a signal representative of a voltage between two nodes, which are selected in accordance with the selection signal, of a plurality of nodes consisting of both ends of a plurality of voltage sources connected in series and connecting points of the voltage sources, and a signal representative of a difference voltage between a voltage of one battery, which is selected from among the plurality of batteries in accordance with the selection signal and slice voltages on said plurality of voltage sources, in accordance with a plurality of signals derived from a monitor signal output circuit having said differential amplifier, each of said plurality of signals being representative of a voltage between nodes in which at least one node is different from another node; and
an offset correction section for correcting measurement errors of voltages of the plurality of batteries in accordance with the signals representative of difference voltages associated with the plurality of batteries, derived from said monitor signal output circuit, and the offset voltage computed in said offset computing section.

18. A battery voltage monitor circuit according to claim 17, wherein said offset computing section computes the offset voltage of said differential amplifier in accordance with three signals representative of a first voltage involved in a first voltage source of the plurality of voltage sources, a second voltage involved in a second voltage source of the plurality of voltage sources, and a third voltage involved in a voltage source in combination of said first voltage source and said second voltage source.

19. A battery system comprising:
a plurality of batteries-connected in series;
a plurality of voltage sources connected in series;
a monitor signal output circuit having a differential amplifier which outputs a signal selected in accordance with a selection signal of a plurality of signals consisting of a signal representative of a voltage between two nodes, which are selected in accordance with the selection signal, of a plurality of nodes consisting of both ends of said plurality of voltage sources connected in series and connecting points of the voltage sources, and a signal representative of a difference voltage between a voltage of one battery, which is selected from among the plurality of batteries in accordance with the selection signal and slice voltages on said plurality of voltage sources; and
a battery voltage monitor circuit having an offset computing section for computing an offset voltage of said differential amplifier in accordance with a plurality of signals derived from said monitor signal output circuit, each of said plurality of signals being representative of a voltage between nodes in which at least one node is different from another node, and an offset correction section for correcting measurement errors of voltages of the plurality of batteries in accordance with the signals representative of difference voltages associated with the plurality of batteries, derived from said monitor signal output circuit, and the offset voltage computed in said offset computing section.

20. An apparatus operative upon receipt of supply of an electric power, said apparatus comprising:
a plurality of batteries connected in series;
a plurality of voltage sources connected in series;
a monitor signal output circuit having a differential amplifier which outputs a signal selected in accordance with a selection signal of a plurality of signals consisting of a signal representative of a voltage between two nodes, which are selected in accordance with the selection signal, of a plurality of nodes consisting of both ends of said plurality of voltage sources connected in series and connecting points of the voltage sources, and a signal representative of a difference voltage between a voltage of one battery, which is selected from among the plurality of batteries in accordance with the selection signal and slice voltages on said plurality of voltage sources; and a battery voltage monitor circuit having an offset computing section for computing an offset voltage of said differential amplifier in accordance with a plurality of signals derived from said monitor signal output circuit, each of said plurality of signals being representative of a voltage between nodes in which at least one node is different from another node, and an offset correction section for correcting measurement errors of voltages of the plurality of batteries in accordance with the signals representative of difference voltages associated with the plurality of batteries, derived from said monitor signal output circuit, and the offset voltage computed in said offset computing section.

21. A battery voltage monitor method comprising steps of:

computing an offset voltage of a differential amplifier, which outputs a signal selected in accordance with a selection signal of a plurality of signals consisting of a signal representative of a voltage between two nodes, which are selected in accordance with the selection signal, of a plurality of nodes consisting of both ends of a plurality of voltage sources connected in series and connecting points of the voltage sources, and a signal representative of a difference voltage between a voltage of one battery, which is selected from among the plurality of batteries in accordance with the selection signal and slice voltages on said plurality of voltage sources, in accordance with a plurality of signals derived from a monitor signal output circuit having said differential amplifier, each of said plurality of signals being representative of a voltage between nodes in which at least one node is different from another node; and correcting measurement errors of voltages of the plurality of batteries in accordance with the signals representative of difference voltages associated with the plurality of batteries, derived from said monitor signal output circuit, and the offset voltage computed in said offset computing section.

22. A battery voltage monitor program storage medium storing a battery voltage monitor program which causes a computer to operate as an apparatus for monitoring a voltage of a battery when the battery voltage monitor program is executed in said computer, wherein said battery voltage monitor program storage medium stores the battery voltage monitor program having an offset computing section for computing an offset voltage of a differential amplifier, which outputs a signal selected in accordance with a selection signal of a plurality of signals consisting of a signal representative of a voltage between two nodes, which are selected in accordance with the selection signal, of a plurality of nodes consisting of both ends of a plurality of voltage sources connected in series and connecting points of the voltage sources, and a signal representative of a difference voltage between a voltage of one battery, which is selected from among the plurality of batteries in accordance with the selection signal and slice voltages on said plurality of voltage sources, in accordance with a plurality of signals derived from a monitor signal output circuit having said differential amplifier, each of said plurality of signals being representative of a voltage between nodes in which at least one node is different from another node; and an offset correction section for correcting measurement errors of voltages of the plurality of batteries in accordance with the signals representative of difference voltages associated with the plurality of batteries, derived from said monitor signal output circuit, and the offset voltage computed in said offset computing section.

* * * * *